(12) United States Patent
Hinode et al.

(10) Patent No.: US 10,672,627 B2
(45) Date of Patent: Jun. 2, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Taiki Hinode, Kyoto (JP); Sadamu Fujii, Kyoto (JP); Nobuyuki Shibayama, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 0 days.

(21) Appl. No.: 16/046,175

(22) Filed: Jul. 26, 2018

(65) Prior Publication Data
US 2019/0067045 A1   Feb. 28, 2019

(30) Foreign Application Priority Data
Aug. 31, 2017   (JP) .................................. 2017-166501

(51) Int. Cl.
*H01L 21/67* (2006.01)
*B08B 3/04* (2006.01)
(Continued)

(52) U.S. Cl.
CPC ........ *H01L 21/67034* (2013.01); *B08B 3/041* (2013.01); *B08B 3/08* (2013.01);
(Continued)

(58) Field of Classification Search
CPC ......... H01L 21/67034; H01L 21/02057; H01L 21/67051; H01L 21/67167; B08B 3/041; B08B 3/08
See application file for complete search history.

(56) References Cited

U.S. PATENT DOCUMENTS

| 2012/0260946 A1 | 10/2012 | Ogata et al. ................. 134/18 |
| 2014/0065295 A1 | 3/2014 | Emoto et al. .................. 427/8 |

(Continued)

FOREIGN PATENT DOCUMENTS

| CN | 106960807 A | 7/2017 |
| JP | 2009-224692 A | 10/2009 |

(Continued)

*Primary Examiner* — Sharidan Carrillo
(74) *Attorney, Agent, or Firm* — Ostrolenk Faber LLP

(57) ABSTRACT

A substrate processing method includes a substrate holding step of disposing a substrate at a position surrounded by a plurality of guards which have a first guard and a second guard in a plan view and of holding the substrate horizontally, a substrate rotating step of rotating the substrate around a vertical rotation axis which passes through a central portion of the substrate, a hydrophobic agent supplying step of supplying to the upper surface of the substrate in a rotating state a hydrophobic agent which is a liquid for hydrophobizing the upper surface of the substrate, a low surface-tension liquid supplying step of supplying the low surface-tension liquid to the upper surface of the substrate in the rotating state in order to replace the hydrophobic agent on the substrate by the low surface-tension liquid lower in surface tension than water, a first guard switching step of switching a state of the plurality of guards to a first state in which the first guard receives a liquid scattered from the substrate by moving at least one of the plurality of guards up and down before start of the low surface-tension liquid supplying step, and a second guard switching step of switching a state of the plurality of guards from the first state to a second state in which the second guard receives a liquid scattered from the substrate by moving the plurality of guards up and down during execution of the low surface-tension liquid supplying step.

9 Claims, 21 Drawing Sheets

(51) Int. Cl.
*B08B 3/08* (2006.01)
*H01L 21/02* (2006.01)

(52) U.S. Cl.
CPC .. *H01L 21/02057* (2013.01); *H01L 21/67028* (2013.01); *H01L 21/67051* (2013.01); *H01L 21/67167* (2013.01)

(56) References Cited

U.S. PATENT DOCUMENTS

| | | | |
|---|---|---|---|
| 2017/0200624 A1 | 7/2017 | Higashijima et al. | |
| 2017/0301534 A1 | 10/2017 | Nakamori et al. | |
| 2018/0061631 A1 | 3/2018 | Hinode et al. | |
| 2019/0067046 A1* | 2/2019 | Hinode | H01L 21/02057 |
| 2019/0088469 A1* | 3/2019 | Tanaka | H01L 21/02057 |
| 2019/0088511 A1* | 3/2019 | Tanaka | H01L 21/67051 |
| 2019/0091733 A1* | 3/2019 | Iwao | B08B 3/04 |

FOREIGN PATENT DOCUMENTS

| | | |
|---|---|---|
| JP | 2012-222329 A | 11/2012 |
| JP | 2014-197571 A | 10/2014 |
| JP | 2016-021597 A | 2/2016 |
| JP | 2018-037551 A | 3/2018 |
| KR | 10-2017-0073594 A | 6/2017 |
| TW | 201312678 A1 | 3/2013 |

\* cited by examiner

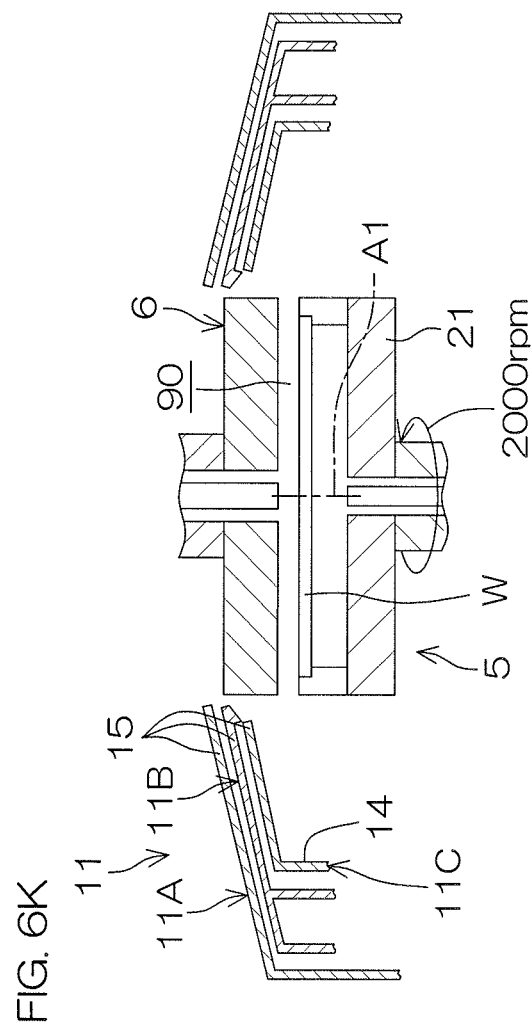

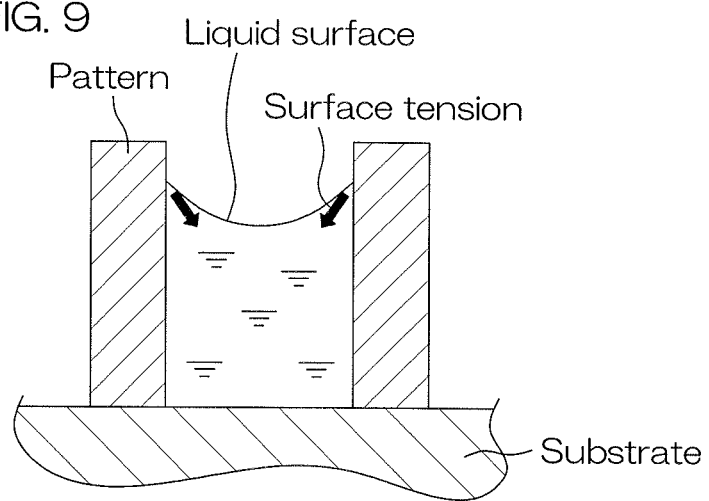

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing substrates. Examples of substrates to be processed include substrates such as semiconductor wafers, substrates for liquid crystal displays, substrates for FPDs (Flat Panel Displays) such as organic ELs (Electroluminescence), substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus, substrates are processed one at a time. In detail, a substrate is held substantially horizontally by a spin chuck. Then, after processing of an upper surface of the substrate by a chemical liquid, the upper surface of the substrate is rinsed by a rinse liquid. Thereafter, a spin drying step is executed in which the substrate is rotated at a high speed for drying the upper surface of the substrate.

As shown in FIG. 9, where a fine pattern is formed on a front surface of a substrate, in the spin drying step, it may not be possible to satisfactorily dry a rinse liquid which has entered into an interior of the pattern. Drying failure may occur thereby. A liquid surface (interface between air and liquid) of the rinse liquid that entered into an interior of the pattern is formed inside the pattern. Therefore, a surface tension of the liquid acts on a position at which the liquid surface is in contact with the pattern. Where the surface tension is large, the pattern may easily collapse. Since water that is a typical example of the rinse liquid is large in surface tension, collapse of a pattern cannot be ignored in the spin drying step.

Thus, there has been proposed a method for using isopropyl alcohol (IPA) which is a low surface-tension liquid lower in surface tension than water (refer to, for example, Japanese Patent Application Publication No. 2016-21597). Specifically, IPA is supplied to an upper surface of a substrate to replace water entered into an interior of a pattern by IPA and remove IPA thereafter, thereby drying the upper surface of the substrate. However, even where water that entered into the interior of the pattern is replaced by IPA, collapse of the pattern may occur, if a surface tension acts thereon for a longer time or the pattern is low in strength.

Thus, Japanese Patent Application Publication No. 2012-222329 has disclosed substrate processing by which an upper surface of a substrate is hydrophobized by a silylating agent to lower a surface tension applied to a pattern, thereby preventing collapse of the pattern. Specifically, a silylating agent is supplied to an upper surface of a substrate and the silylating agent supplied to the upper surface of the substrate flows so as to spread from a center of the upper surface of the substrate to a peripheral edge thereof due to rotation of the substrate. Thereby, the upper surface of substrate in its entirety is hydrophobized. Thereafter, the silylating agent that remains on the upper surface of the substrate is washed away by IPA and the substrate is then dried. The silylating agent and IPA which have been removed from the upper surface of the substrate are received by a cup portion.

SUMMARY OF THE INVENTION

In the substrate processing described in Japanese Patent Application Publication No. 2012-222329, the silylating agent scattered from the substrate is received by the cup portion, by which the silylating agent is adhered to the cup portion. Then, when the silylating agent on the substrate is washed away by IPA, IPA scattered from the substrate is received by the cup portion. Therefore, a mixed liquid of the silylating agent adhered to the cup portion and IPA scattered from the substrate may be splashed back from the cup portion and adhered to the upper surface of the substrate. Thereby, particles may be generated on the upper surface of the substrate, and the upper surface of the substrate may not be satisfactorily dried. In particular, where the silylating agent is adhered to the upper surface of the substrate after completion of supply of IPA, the silylating agent is not washed away and may easily cause the generation of particles.

Further, even where no liquid splashed back from the cup portion is adhered to a substrate, mist and vapor of a hydrophobic agent are present in the atmosphere in the vicinity of the cup portion. Where mist and vapor of the hydrophobic agent have reached the upper surface of the substrate, particles may also be generated.

Thus, an object of the present invention is to provide a substrate processing method and a substrate processing apparatus capable of satisfactorily drying an upper surface of a substrate.

A preferred embodiment of the present invention provides a substrate processing method which includes a substrate holding step of disposing a substrate at a position surrounded by a plurality of guards which have a first guard and a second guard in a plan view and of holding the substrate horizontally, a substrate rotating step of rotating the substrate around a vertical rotation axis which passes through a central portion of the substrate, a hydrophobic agent supplying step of supplying to an upper surface of the substrate in a rotating state a hydrophobic agent which is a liquid for hydrophobizing the upper surface of the substrate, a low surface-tension liquid supplying step of supplying a low surface-tension liquid to the upper surface of the substrate in the rotating state in order to replace the hydrophobic agent on the substrate by the low surface-tension liquid lower in surface tension than water, a first guard switching step of switching a state of the plurality of guards to a first state in which the first guard receives a liquid scattered from the substrate by moving at least one of the plurality of guards up and down before start of the low surface-tension liquid supplying step, and a second guard switching step of switching the state of the plurality of guards from the first state to a second state in which the second guard receives a liquid scattered from the substrate by moving the plurality of guards up and down during execution of the low surface-tension liquid supplying step.

According to the above-described method, before the low surface-tension liquid supplying step, the upper surface of the substrate is hydrophobized by the hydrophobic agent. Therefore, it is possible to lower a surface tension of the low surface-tension liquid which is applied to the upper surface of the substrate.

Further, during execution of the low surface-tension liquid supplying step, a state of the plurality of guards is switched to the first state to the second state. That is, after the hydrophobic agent on the substrate has been at least partially scattered from the substrate, a guard which receives the liquid scattered from the substrate is switched from the first guard to the second guard. Accordingly, the hydrophobic agent is suppressed or prevented from being adhered to the second guard. Therefore, the hydrophobic agent is suppressed from being splashed back from the second guard and adhered to the upper surface of the substrate.

Further, the state of the plurality of guards is not switched after completion of the low surface-tension liquid supplying step but switched during execution of the low surface-tension liquid supplying step. Therefore, even if the hydrophobic agent is splashed back from the first guard and adhered to the substrate, the hydrophobic agent on the substrate is washed away by the low surface-tension liquid. Thereby, generation of particles is suppressed.

Still further, until the first state has been switched to the second state, the first guard is washed by the low surface-tension liquid. Thereby, the hydrophobic agent remaining in the first guard as well as mist and vapor of the hydrophobic agent present in the atmosphere in the vicinity of the first guard are decreased in amount. Therefore, the hydrophobic agent is suppressed or prevented from being adhered to the substrate.

As described so far, a surface tension of the low surface-tension liquid which is applied to the upper surface of the substrate is lowered and the generation of particles is also suppressed. As a result, it is possible to satisfactorily dry the substrate.

It is noted that "replacement" herein means that a liquid on a substrate in its entirety is replaced by a liquid which is newly supplied.

In a preferred embodiment of the present invention, the second guard switching step includes a step of switching the state of the plurality of guards from the first state to the second state such that time during which the first guard receives the low surface-tension liquid is made longer than time during which the second guard receives the low surface-tension liquid.

Accordingly, it is possible to decrease an amount of the hydrophobic agent present on the substrate when the first state is switched to the second state. It is, therefore, possible to effectively suppress or prevent the hydrophobic agent from being adhered to the second guard. Further, since the first guard is cleaned for a longer time by the low surface-tension liquid, the hydrophobic agent remaining in the first guard as well as mist and vapor of the hydrophobic agent present in the atmosphere in the vicinity of the first guard are decreased in amount.

In a preferred embodiment of the present invention, the second guard switching step includes a step of switching the state of the plurality of guards from the first state to the second state after the hydrophobic agent on the substrate has been replaced by the low surface-tension liquid. Accordingly, the hydrophobic agent is more effectively suppressed or prevented from being adhered to the second guard.

In a preferred embodiment of the present invention, the substrate processing method further includes a substrate drying step in which the substrate is rotated to remove the low surface-tension liquid on the substrate, thereby drying the substrate. Therefore, it is possible to smoothly remove the low surface-tension liquid on the substrate. Consequently, it is possible to reduce the time that the low surface-tension liquid applies a surface tension to the upper surface of the substrate.

In a preferred embodiment of the present invention, the substrate processing method further includes an evacuating step of evacuating the atmosphere between the upper surface of the substrate and a facing surface, which faces the upper surface of the substrate, of a facing member after the first guard switching step. Further, the first guard switching step includes a sealing step in which at least one of an upper end of the first guard and that of the second guard is positioned at a height position equal to the facing surface or positioned higher than the facing surface.

According to the above-described method, at least one of the upper end of the first guard and that of the second guard is positioned at a height position equal to the facing surface of the facing member or positioned higher than the facing surface, thereby enhancing the degree of sealing of a space between the upper surface of the substrate and the facing surface. In this state, the atmosphere between the upper surface of the substrate and the facing surface is evacuated, thus making it possible to efficiently remove mist of the hydrophobic agent drifting between the upper surface of the substrate and the facing surface. It is, thereby, possible to suppress the hydrophobic agent from being adhered to the upper surface of the substrate, while the low surface-tension liquid is supplied to the substrate.

In a preferred embodiment of the present invention, the first guard switching step includes a step of switching the state of the plurality of guards to the first state in which a liquid scattered from the substrate passes between a first extension portion which extends obliquely above toward the facing member from an upper end of a first tubular portion provided at the first guard and a second extension portion extending obliquely above toward the facing member from the upper end of the second tubular portion provided at the second guard and facing the first extension portion from below, and is received by the first tubular portion. Then, the second guard switching step includes a step of switching the state of the plurality of guards to the second state in which an interval between the first extension portion and the second extension portion is made narrower than that in the first state such that a liquid scattered from the substrate passes below the second extension portion and is received by the second tubular portion.

According to the above-described method, the liquid scattered from the substrate in the first state passes between the first extension portion and the second extension portion and is received by the first tubular portion. Accordingly, mist of the hydrophobic agent may drift between the first extension portion and the second extension portion. Therefore, before the state of the plurality of guards is switched to the second state, a liquid which has incorporated mist of the hydrophobic agent may be splashed back from the plurality of guards and adhered to the upper surface of the substrate.

On the other hand, after a state of the plurality of guards has been switched to the second state, a liquid scattered from the substrate passes below the second extension portion and is received by the second tubular portion. That is, the liquid scattered from the substrate passes through a passage which is different from a passage between the first extension portion and the second extension portion at which mist of the hydrophobic agent may drift. Therefore, the liquid splashed back from the plurality of guards is suppressed from incorporating mist of the hydrophobic agent.

Further, even after the state of the plurality of guards has been switched to the second state, mist of the hydrophobic agent may flow out between the first extension portion and the second extension portion, reach a space between the facing surface of the facing member and the upper surface of the substrate and finally be adhered to the upper surface of the substrate. Thus, when the state of the plurality of guards is switched from the first state to the second state, the interval between the first extension portion and the second extension portion is made narrow, thus making it possible to suppress mist of the hydrophobic agent from flowing out between the first extension portion and the second extension portion.

In a preferred embodiment of the present invention, the low surface-tension liquid supplying step includes a step of discharging the low surface-tension liquid to the upper surface of the substrate. Further, the second guard switching step includes a step of switching the state of the plurality of guards to the second state, while the low surface-tension liquid is discharged from the discharge port.

According to the above-described method, in the second guard switching step, a state of the plurality of guards is switched to the second state by allowing the plurality of guards to move up and down during discharge of the low surface-tension liquid. Thereby, a portion of the first guard and that of the second guard which receive the low surface-tension liquid scattered from the substrate are changed during discharge of the low surface-tension liquid. Therefore, the first guard can be cleaned when a state of the plurality of guards is switched to the second state.

In a preferred embodiment of the present invention, the substrate processing method further includes a chemical liquid supplying step of supplying to the upper surface of the substrate a chemical liquid for processing the upper surface of the substrate before the hydrophobic agent supplying step, a rinse liquid supplying step of supplying to the upper surface of the substrate a rinse liquid for washing away the chemical liquid after the chemical liquid supplying step and also before the hydrophobic agent supplying step, and an organic solvent supplying step of supplying to the upper surface of the substrate an organic solvent which is miscible with the rinse liquid and the hydrophobic agent after the rinse liquid supplying step and also before the hydrophobic agent supplying step.

According to the above-described method, the organic solvent is miscible with both the rinse liquid and the hydrophobic agent. Therefore, even where the rinse liquid is not miscible with the hydrophobic agent, the organic solvent is supplied to the upper surface of the substrate and the rinse liquid on the substrate is replaced by the organic solvent, thereafter, the hydrophobic agent is supplied to the upper surface of the substrate to replace the organic solvent on the substrate by the hydrophobic agent, thus making it possible to cover the upper surface of the substrate by the hydrophobic agent. Therefore, the degree of freedom is enhanced in selecting the rinse liquid and the hydrophobic agent.

In a preferred embodiment of the present invention, the substrate processing method further includes a heating fluid supplying step of supplying to a lower surface of the substrate a heating fluid for heating the substrate in parallel with the organic solvent supplying step.

According to the above-described method, before the hydrophobic agent supplying step, the substrate is heated in advance by warm water. Accordingly, the hydrophobic agent can be increased in activity. Thereby, the upper surface of the substrate can be uniformly hydrophobized. Therefore, it is possible to suppress collapse of a pattern formed on the upper surface of the substrate.

The other preferred embodiment of the present invention provides a substrate processing apparatus which includes a substrate holding unit which holds a substrate horizontally, a substrate rotating unit which rotates the substrate around a vertical rotation axis which passes through a central portion of the substrate, a hydrophobic agent supplying unit which supplies to an upper surface of the substrate a hydrophobic agent which is a liquid for hydrophobizing the upper surface of the substrate, a low surface-tension liquid supplying unit which supplies to the upper surface of the substrate a low surface-tension liquid which is lower in surface tension than water, a plurality of guards which surround the substrate in a plan view and have a first guard and a second guard for receiving a liquid scattered from the substrate, a guard switching unit which switches a state of the plurality of guards between a first state in which a liquid scattered from the substrate is received by the first guard and a second state in which a liquid scattered from the substrate is received by the second guard by allowing at least one of the plurality of guards to move up and down, and a controller which controls the substrate rotating unit, the hydrophobic agent supplying unit, the low surface-tension liquid supplying unit and the guard switching unit.

Then, the controller is programmed so as to execute a substrate rotating step of rotating the substrate which is held by the substrate holding unit at a position surrounded by the plurality of guards in a plan view around the rotation axis by the substrate rotating unit, a hydrophobic agent supplying step of supplying the hydrophobic agent to the upper surface of the substrate in a rotating state from the hydrophobic agent supplying unit, a low surface-tension liquid supplying step of supplying the low surface-tension liquid to the substrate in the rotating state from the low surface-tension liquid supplying unit in order to replace the hydrophobic agent on the substrate by the low surface-tension liquid, a first guard switching step switching the state of the plurality of guards to the first state by the guard switching unit before start of the low surface-tension liquid supplying step, and a second guard switching step of switching the state of the plurality of guards from the first state to the second state by the guard switching unit during execution of the low surface-tension liquid supplying step.

According to the above-described configuration, before the low surface-tension liquid supplying step, the upper surface of the substrate is hydrophobized by the hydrophobic agent. Accordingly, a surface tension of the low surface-tension liquid which is applied to the upper surface of the substrate is lowered.

Further, during execution of the low surface-tension liquid supplying step, a state of the plurality of guards is switched from the first state to the second state. That is, after the hydrophobic agent on the substrate has been at least partially scattered from the substrate, a guard which receives the liquid scattered from the substrate is switched from the first guard to the second guard. Accordingly, the hydrophobic agent is suppressed or prevented from being adhered to the second guard. Therefore, it is possible to suppress the hydrophobic agent from being splashed back from the second guard and adhered to the upper surface of the substrate.

Further, the state of the plurality of guards is not switched after completion of the low surface-tension liquid supplying step but is switched during execution of the low surface-tension liquid supplying step. Therefore, even if the hydrophobic agent is splashed back from the first guard and adhered to the substrate, the hydrophobic agent on the substrate is washed away by the low surface-tension liquid. Thereby, generation of particles is suppressed.

Still further, until the first state has been switched to the second state, the first guard is washed away by the low surface-tension liquid. Thereby, the hydrophobic agent remaining at the first guard as well as mist and vapor of the hydrophobic agent present in the atmosphere in the vicinity of the first guard are decreased in amount. Therefore, the hydrophobic agent is suppressed or prevented from being adhered to the substrate.

As described so far, a surface tension of the low surface-tension liquid which is applied to the upper surface of the substrate is lowered and the generation of particles is also suppressed, and thereby, it is possible to satisfactorily dry the substrate.

In the other preferred embodiment of the present invention, the controller is programmed so as to switch, in the second guard switching step, the state of the plurality of guards from the first state to the second state by the guard switching unit such that time during which the first guard receives the low surface-tension liquid will be made longer than time during which the second guard receives the low surface-tension liquid.

Accordingly, it is possible to decrease an amount of the hydrophobic agent present on the substrate when the first state is switched to the second state. Therefore, the hydrophobic agent is effectively suppressed or prevented from being adhered to the second guard. Further, the first guard is cleaned for a longer time by the low surface-tension liquid and, thus, the hydrophobic agent remaining at the first guard as well as mist and vapor of the hydrophobic agent present in the atmosphere in the vicinity of the first guard are decreased in amount.

In the other preferred embodiment of the present invention, the controller is programmed so as to switch, in the second guard switching step, the state of the plurality of guards from the first state to the second state by the guard switching unit after the hydrophobic agent on the substrate has been replaced by the low surface-tension liquid. Accordingly, the hydrophobic agent is more effectively suppressed or prevented from being adhered to the second guard.

In the other preferred embodiment of the present invention, the controller is programmed so as to execute a substrate drying step in which the substrate is rotated by the substrate rotating unit to remove the low surface-tension liquid on the substrate, thereby drying the substrate. Accordingly, it is possible to remove quickly the low surface-tension liquid on the substrate. It is, therefore, possible to reduce the time that a surface tension of the low surface-tension liquid is applied to the upper surface of the substrate.

In the other preferred embodiment of the present invention, the substrate processing apparatus further includes a facing member having a facing surface that faces the upper surface of the substrate and an evacuating unit for evacuating the atmosphere between the upper surface of the substrate and the facing surface.

Then, the controller is programmed so as to execute an evacuating step of evacuating the atmosphere between the upper surface of the substrate and the facing surface by the evacuating unit and also so as to execute, in the first guard switching step, a sealing step in which at least one of an upper end of the first guard and that of the second guard is positioned by the guard switching unit at a height position equal to the facing surface or higher than the facing surface.

According to the above-described configuration, at least one of the upper end of the first guard and that of the second guard is positioned at a height position equal to the facing surface of the facing member or higher than the facing surface, thereby enhancing the degree of sealing of a space between the upper surface of the substrate and the facing surface. In this state, the atmosphere between the upper surface of the substrate and the facing surface can be evacuated to efficiently remove mist of the hydrophobic agent drifting between the upper surface of the substrate and the facing surface. Thereby, the hydrophobic agent is suppressed from being adhered to the upper surface of the substrate, while the low surface-tension liquid is supplied to the substrate.

In the other preferred embodiment of the present invention, the first guard includes a first tubular portion which surrounds the substrate and a first extension portion which extends obliquely above from an upper end of the first tubular portion toward the facing member. Then, the second guard includes a second tubular portion which surrounds the substrate further inside than the first tubular portion and a second extension portion which extends obliquely above from an upper end of the second tubular portion toward the facing member and faces the first extension portion from below.

Then, the controller is programmed so as to execute, in the first guard switching step, a step of switching the state of the plurality of guards to the first state in which a liquid scattered from the substrate passes between the first extension portion and the second extension portion and is received by the first tubular portion and also so as to execute, in the second guard switching step, a step of switching the state of the plurality of guards to the second state in which an interval between the first extension portion and the second extension portion is made narrower than that in the first state such that a liquid scattered from the substrate passes below the second extension portion and is received by the second tubular portion.

According to the above-described configuration, in the first state, the liquid scattered from the substrate passes between the first extension portion and the second extension portion and is received by the first tubular portion. Accordingly, mist of the hydrophobic agent may drift between the first extension portion and the second extension portion. Therefore, before a state of the plurality of guards is switched to the second state, a liquid which has incorporated mist of the hydrophobic agent may be splashed back from the plurality of guards and adhered to the upper surface of the substrate.

On the other hand, after a state of the plurality of guards has been switched to the second state, the liquid scattered from the substrate passes below the second extension portion and is received by the second tubular portion. That is, the liquid scattered from the substrate passes through a passage which is different from a passage between the first extension portion and the second extension portion around which mist of the hydrophobic agent may drift. Therefore, the liquid splashed back from the plurality of guards is suppressed from incorporating mist of the hydrophobic agent.

Further, even after a state of the plurality of guards has been switched to the second state, mist of the hydrophobic agent may flow out between the first extension portion and the second extension portion, reach a space between the facing surface of the facing member and the upper surface of the substrate and finally be adhered to the upper surface of the substrate. Thus, when a state of the plurality of guards is switched from the first state to the second state, an interval between the first extension portion and the second extension portion is made narrower, thus making it possible to suppress mist of the hydrophobic agent from flowing out between the first extension portion and the second extension portion.

In the other preferred embodiment of the present invention, the low surface-tension liquid supplying unit has a discharge port for discharging the low surface-tension liquid. Then, the controller is programmed so as to execute, in the second guard switching step, a step in which, while the low surface-tension liquid is discharged from the discharge port, the guard switching unit switches the state of the plurality of guards to the second state.

According to the above-described configuration, in the second guard switching step, while the low surface-tension liquid is discharged, the plurality of guards are moved up and down, by which the state of the plurality of guards is switched to the second state. Thereby, a portion of the first guard and that of the second guard which receive the low surface-tension liquid scattered from the substrate are changed while the low surface-tension liquid is discharged. Therefore, the first guard can be cleaned when the state of the plurality of guards is switched to the second state.

In the other preferred embodiment of the present invention, the substrate processing apparatus further includes a chemical liquid supplying unit which supplies to the upper surface of the substrate a chemical liquid for processing the upper surface of the substrate, a rinse liquid supplying unit which supplies to the upper surface of the substrate a rinse liquid for washing away the chemical liquid, and an organic solvent supplying unit which supplies to the upper surface of the substrate an organic solvent which is miscible with the rinse liquid and the hydrophobic agent.

The controller is programmed so as to execute a chemical liquid supplying step of supplying the chemical liquid to the upper surface of the substrate from the chemical liquid supplying unit before the hydrophobic agent supplying step, a rinse liquid supplying step of supplying the rinse liquid to the upper surface of the substrate from the rinse liquid supplying unit after the chemical liquid supplying step and also before the hydrophobic agent supplying step, and an organic solvent supplying step of supplying the organic solvent to the upper surface of the substrate from the organic solvent supplying unit after the rinse liquid supplying step and also before the hydrophobic agent supplying step.

According to the above-described configuration, the organic solvent is miscible with both the rinse liquid and the hydrophobic agent. Therefore, even where the rinse liquid is not miscible with the hydrophobic agent, the organic solvent is supplied to the upper surface of the substrate to replace the rinse liquid on the substrate by the organic solvent and, thereafter, the hydrophobic agent is supplied to the upper surface of the substrate to replace the organic solvent on the substrate by the hydrophobic agent, thus making it possible to cover the upper surface of the substrate by the hydrophobic agent. It is, therefore, possible to enhance a degree of freedom in selecting the rinse liquid and the hydrophobic agent.

In the other preferred embodiment of the present invention, the substrate processing apparatus further includes a heating fluid supplying unit which supplies to the lower surface of the substrate a heating fluid for heating the substrate. Then, the controller is programmed so as to execute a heating fluid supplying step which supplies the heating fluid to a lower surface of the substrate in parallel with the organic solvent supplying step.

According to the above-described configuration, before the hydrophobic agent supplying step, the substrate is heated in advance by warm water. Accordingly, the hydrophobic agent can be enhanced in activity. Thereby, the upper surface of the substrate can be uniformly hydrophobized. It is, therefore, possible to suppress collapse of a pattern formed on the upper surface of the substrate.

Here, a description will be given of a polymerization reaction of a hydrophobic agent and reactions of the hydrophobic agent with the upper surface of the substrate. As shown in FIG. 8A, the unreacted hydrophobic agent is expressed by, for example, $Si(OR)_3Y$. R and Y are simplified for expressing a substituent such as an alkyl group, etc. The hydrophobic agent reacts with water molecules ($H_2O$) to produce a monomer ($Si(OH)_3Y$). Then, monomers react with each other to forma dimer (refer to a chemical formula shown at the center of FIG. 8B). The polymerization reaction proceeds further to finally form a polymer (refer to a chemical formula on the right side of FIG. 8B). The lower the humidity of the atmosphere in contact with a liquid film on the substrate is, the less likely the hydrophobic agent is to undergo polymerization. The higher the humidity of the atmosphere in contact with a liquid film of the substrate is, the more likely the hydrophobic agent is to undergo polymerization.

Where the humidity of the atmosphere in contact with a liquid film on the substrate is low, the hydrophobic agent reacts with a hydroxyl group exposed on the upper surface of the substrate before polymerization. Thereby, although the upper surface of the substrate is hydrophobized, the unreacted hydrophobic agent remains on the substrate even after the upper surface of the substrate has been hydrophobized. Therefore, there is a problem that this causes the generation of particles.

Where the humidity of the atmosphere in contact with a liquid film of the substrate is high, the hydrophobic agent undergoes polymerization before reactions with a hydroxyl group exposed on the upper surface of the substrate, to forma polymer. Therefore, this causes the generation of particles. Thus, as shown in FIG. 8C, it is necessary to adjust appropriately the humidity of the atmosphere in contact with a liquid film of the substrate such that the hydrophobic agent will appropriately undergo polymerization (for example, dimer).

On the other hand, if the humidity of the atmosphere in contact with a low surface-tension liquid on the substrate is high, water contained in a liquid film of the low surface-tension liquid on the substrate is increased in amount, thereby raising a surface tension, which poses a problem.

Thus, the above-described preferred embodiment can be combined with a configuration given below to solve these problems. Specifically, there may be such a configuration that the substrate processing apparatus further includes a humidity adjusting unit which adjusts the humidity of the atmosphere in the vicinity of the upper surface of the substrate and the controller is programmed so as to execute a humidity adjusting step of adjusting the humidity of the atmosphere in contact with a liquid film on the substrate by the humidity adjusting unit such that the humidity of the atmosphere in contact with a liquid film on the substrate in the hydrophobic agent supplying step reaches a first humidity and also the humidity of the atmosphere in contact with a liquid film on the substrate in the low surface-tension liquid supplying step reaches a second humidity which is humidity lower than the first humidity.

According to the above-described configuration, the humidity of the atmosphere in contact with a liquid film on the substrate in the hydrophobic agent supplying step is made higher than the humidity of the atmosphere in contact with a liquid film on the substrate in the low surface-tension liquid supplying step.

Therefore, in the hydrophobic agent supplying step, the atmosphere in contact with a liquid film on the substrate can be increased in humidity to such an extent that polymerization of the hydrophobic agent will not proceed excessively. Consequently, the hydrophobic agent is suppressed from being polymerized, so that the hydrophobic agent can undergo appropriate polymerization. As a result, it is possible to suppress the generation of particles while making the upper surface of the substrate sufficiently hydrophobic.

Further, in the low surface-tension liquid supplying step, the humidity of the atmosphere in contact with a liquid film on the substrate can be decreased sufficiently. Thereby, it is possible to reduce the amount of water contained in a liquid film of the low surface-tension liquid on the substrate. Therefore, it is possible to lower a surface tension of the low surface-tension liquid on the substrate which is applied to the upper surface of the substrate.

Further, the controller executes, before the hydrophobic agent supplying step, an organic solvent supplying step in which the organic solvent is supplied from the organic solvent supplying unit to the upper surface of the substrate, and the controller may be programmed so as to execute, in the humidity adjusting step, a step in which the humidity of the atmosphere in contact with a liquid film on the substrate is adjusted such that the humidity of the atmosphere in the vicinity of the upper surface of the substrate in the organic solvent supplying step reaches a third humidity which is humidity lower than the first humidity.

If water is contained in an organic solvent on a substrate and when the organic solvent on the substrate is replaced by a hydrophobic agent in the hydrophobic agent supplying step, the hydrophobic agent reacts with water in the organic solvent. Consequently, a polymerization reaction of the hydrophobic agent proceeds and the upper surface of the substrate may not be sufficiently hydrophobized. Thus, in such a configuration that the humidity of the atmosphere in contact with a liquid film on the substrate is made lower than the first humidity in the organic solvent supplying step, it is possible to suppress the hydrophobic agent from being polymerized. As a result, it is possible to further suppress the generation of particles while making the upper surface of the substrate more sufficiently hydrophobic.

Further, the substrate processing apparatus may further include a gas supplying unit which supplies a gas to a space between the facing surface and the upper surface of the substrate, the controller may be programmed so as to execute a gas supplying step in which a gas is supplied from the gas supplying unit toward the space, and the controller may be programmed so as to execute, in the humidity adjusting step, a step of adjusting the humidity inside the space such that, during execution of the gas supplying step, the humidity of the space in the hydrophobic agent supplying step reaches the first humidity and the humidity of the space in the low surface-tension liquid supplying step reaches the second humidity.

According to the above-described configuration, a gas is supplied to the space between the facing surface of the facing member and the upper surface of the substrate, thereby adjusting the humidity of the space between the facing surface of the facing member and the upper surface of the substrate. The humidity of the space between the facing surface of the facing member and the upper surface of the substrate can be adjusted, thereby easily adjusting the humidity of the atmosphere in contact with a liquid film on the substrate.

Further, the substrate processing apparatus may further include a facing member raising/lowering unit which raises and lowers the facing member, and the controller may be programmed so as to execute, in the humidity adjusting step, a step in which the facing member is raised and lowered by the facing member raising/lowering unit, by which a distance between the facing surface and the upper surface of the substrate is changed from a first distance which is a distance between the facing surface and the upper surface of the substrate in the hydrophobic agent supplying step to a second distance smaller than the first distance, thereby changing the humidity of the atmosphere in contact with a liquid film on the substrate from the first humidity to the second humidity.

The hydrophobic agent supplied to the upper surface of the substrate in the hydrophobic agent supplying step may be adhered to the facing surface by being splashed back from the upper surface of the substrate. If the hydrophobic agent adhered to the facing surface drops on the upper surface of the substrate in the low surface-tension liquid supplying step after the hydrophobic agent supplying step, this causes the generation of particles.

Thus, according to a method for adjusting the humidity inside the space so that a distance (first distance) between the facing surface and the upper surface of the substrate in the hydrophobic agent supplying step will be larger than a distance (second distance) between the facing surface and the upper surface of the substrate in the low surface-tension liquid supplying step, in the hydrophobic agent supplying step, in a state that the facing member is separated further from the upper surface of the substrate than that in the low surface-tension liquid supplying step, the hydrophobic agent is supplied to the upper surface of the substrate. The hydrophobic agent can be suppressed from being adhered to the facing surface and, accordingly, suppressing the generation of particles.

The controller may be also programmed so as to execute, in the step of changing the humidity of the atmosphere in contact with a liquid film on the substrate from the first humidity to the second humidity, a step of changing a distance between the facing surface and the upper surface of the substrate from the first distance to the second distance by using the facing member raising/lowering unit to raise and lower the facing member during execution of the low surface-tension liquid supplying step.

Therefore, at least when the hydrophobic agent on the upper surface of the substrate starts to be replaced by the low surface-tension liquid, a distance between the facing surface and the upper surface of the substrate is changed to the second distance. Consequently, it is possible to further suppress the hydrophobic agent from being adhered to the facing surface.

Further, the gas supplying unit may be able to adjust a flow rate of the gas supplied to the space, and the controller may be programmed so as to execute, in the humidity adjusting step, a step in which a supply flow rate of the gas from the gas supplying unit is adjusted, thereby adjusting the humidity inside the space. Therefore, the humidity of the space between the facing surface and the upper surface of the substrate may be adjusted with high accuracy by changing a distance between the facing surface and the upper surface of the substrate and adjusting a supply flow rate of the gas. Consequently, it is possible to adjust the humidity of the atmosphere in contact with a liquid film on the substrate with high accuracy.

The above and other objects, features, and effects of the present invention will become more apparent from the following detailed description of the preferred embodiments with reference to the attached drawings.

BRIEF DESCRIPTION OF THE DRAWINGS

FIG. 6A to FIG. 6K are each an illustrative sectional view for describing one example of the substrate processing.

FIG. 9 is an illustrative sectional view for describing a principle of pattern collapse by a surface tension.

DETAILED DESCRIPTION OF THE PREFERRED EMBODIMENTS

Figure 1:
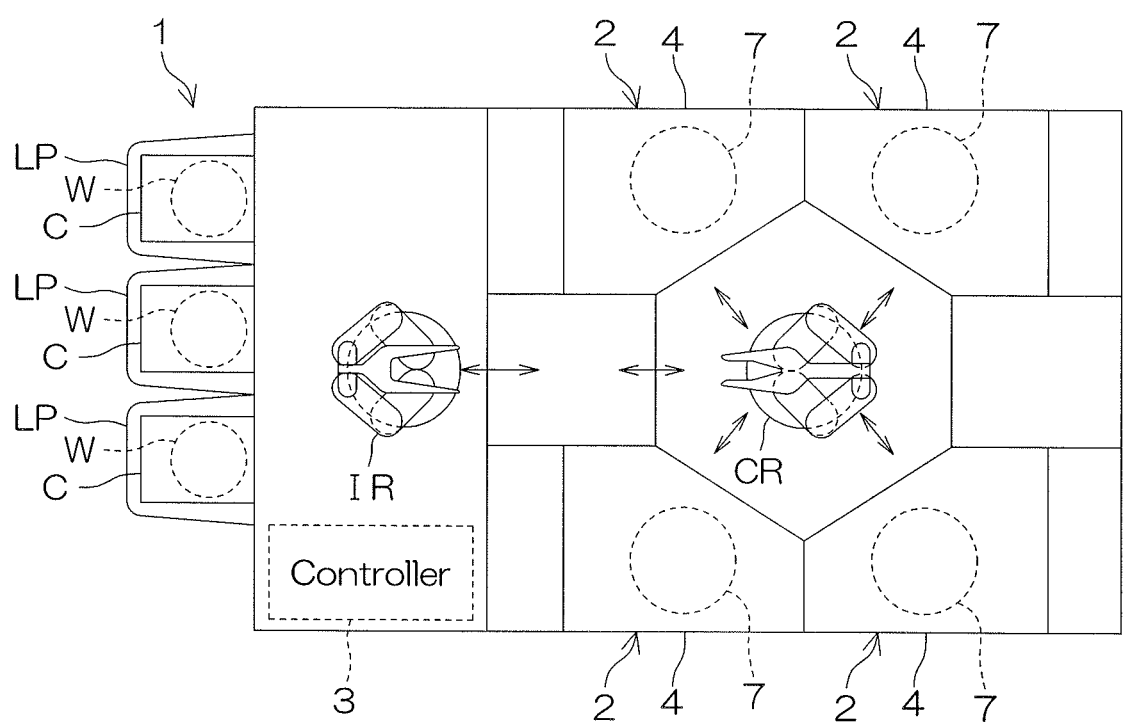
FIG. 1 is a plan view for describing a configuration of a substrate processing apparatus according to a preferred embodiment of the present invention.

FIG. 1 is an illustrative plan view for describing an internal layout of a substrate processing apparatus 1 according to a preferred embodiment of the present invention.

The substrate processing apparatus 1 is a single substrate processing type apparatus which processes substrates W such as silicon wafers, etc., one at a time. In this preferred embodiment, a substrate W is a disk-shaped substrate. The substrate processing apparatus 1 includes a plurality of processing units 2 which process substrates W with a processing liquid, a load port LP in each of which a carrier C, that houses the plurality of substrates W to be processed by the processing unit 2, is placed, transfer robots IR and CR which transfer the substrate W between the load port LP and the processing unit 2, and a controller 3 which controls the substrate processing apparatus 1. The processing liquid includes a chemical liquid, a rinse liquid, an organic solvent, a hydrophobic agent, etc., that will be described later. The transfer robot IR transfers a substrate W between the carrier C and the transfer robot CR. The transfer robot CR transfers a substrate W between the transfer robot IR and the processing unit 2. The plurality of processing units 2 are similar in configuration, for example.

Figure 2:
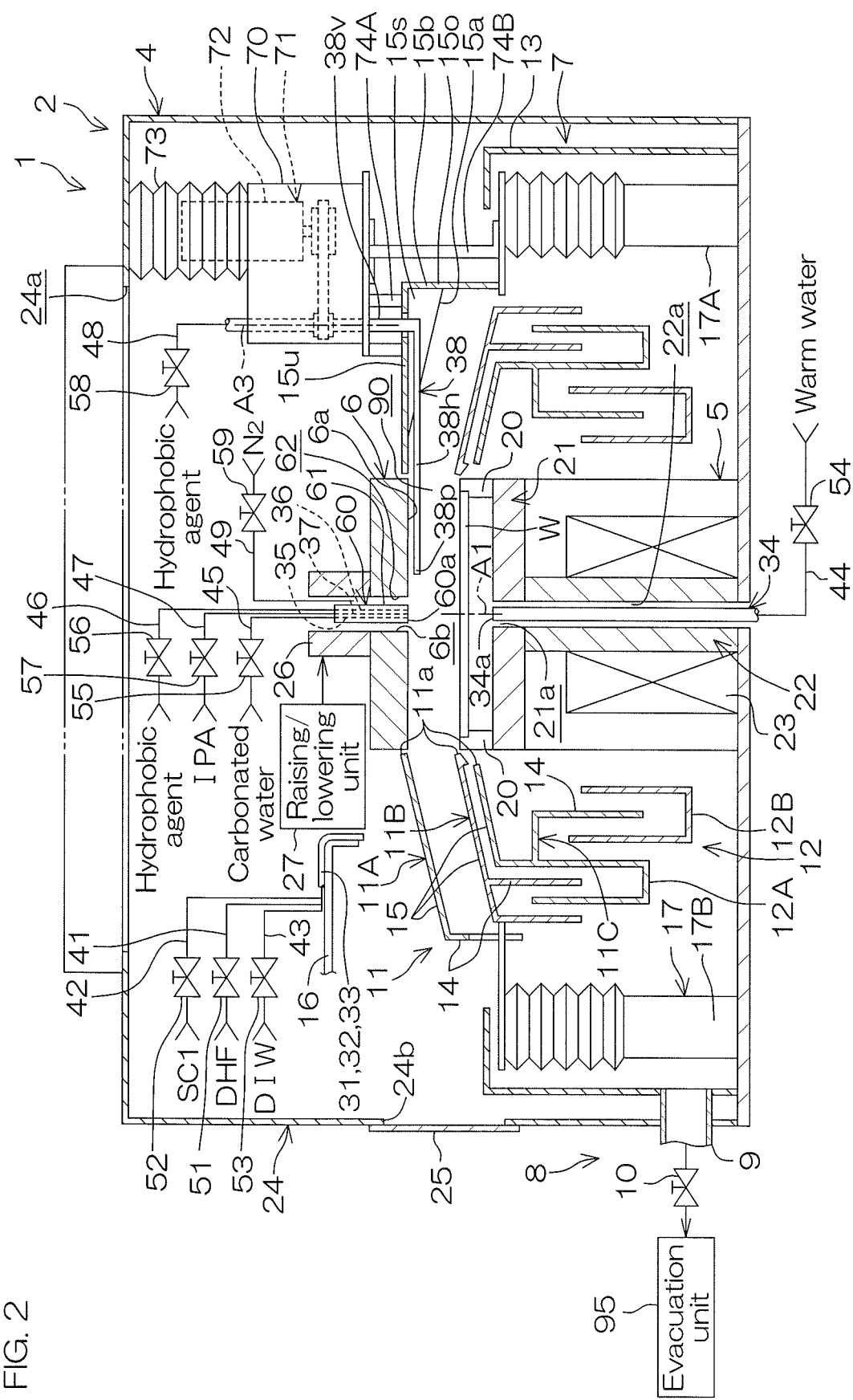
FIG. 2 is an illustrative sectional view for describing an example of configuration of a processing unit included in the substrate processing apparatus.

FIG. 2 is a schematic view for describing an example of configuration of the processing unit 2. The processing unit 2 includes a box-shaped chamber 4, a spin chuck 5, a facing member 6, a tubular processing cup 7 and an evacuating unit 8. The chamber 4 has an internal space. The spin chuck 5 rotates a substrate W around a vertical rotation axis A1, while holding it horizontally inside the chamber 4. The rotation axis A1 passes through a central portion of the substrate W. The facing member 6 faces an upper surface of the substrate held by the spin chuck 5. The processing cup 7 receives a processing liquid which is scattered outside from the substrate W. The evacuating unit 8 evacuates the atmosphere inside the chamber 4.

The chamber 4 includes a box-shaped partition wall 24 having a carry in/out port 24b through which a substrate W passes and a shutter 25 which opens and closes the carry in/out port 24b. Clean air, or air which is filtered, is constantly supplied into the chamber 4 from a ventilation port 24a provided above the partition wall 24.

The evacuating unit 8 includes an evacuating duct 9 connected to a bottom portion of the processing cup 7 and an evacuating valve 10 which opens and closes the evacuating duct 9. The opening degree of the evacuating valve 10 can be adjusted, thereby adjusting a flow rate (evacuation flow rate) of a gas which flows through the evacuating duct 9. The evacuating duct 9 is, for example, connected to an evacuation unit 95 which suctions the interior of the chamber 4. The evacuation unit 95 may be apart of the substrate processing apparatus 1 or may be separately provided from the substrate processing apparatus 1. Where the evacuation unit 95 is apart of the substrate processing apparatus 1, the evacuation unit 95 is, for example, a vacuum pump, etc. A gas in the chamber 4 is drained from the chamber 4 via the evacuating duct 9. Thereby, a downflow of the clean air is constantly formed inside the chamber 4.

While holding a single substrate W in a horizontal posture, the spin chuck 5 rotates the substrate W around the vertical rotation axis A1 passing through a central portion of the substrate W. The spin chuck 5 is included in the substrate holding unit which holds the substrate W horizontally. The substrate holding unit is also referred to as a substrate holder. The spin chuck 5 includes a chuck pin 20, a spin base 21, a rotating shaft 22 and a spin motor 23.

The spin base 21 has a disk shape along a horizontal direction. On the upper surface of the spin base 21, the plurality of chuck pins 20 are disposed at intervals in a circumferential direction. The spin chuck 5 is not limited to a clamping type chuck by which the plurality of chuck pins 20 are brought into contact with an outer circumferential surface of the substrate W. For example, the spin chuck 5 may be a vacuum type chuck which holds the substrate W horizontally by adsorbing a rear surface (lower surface) of the substrate W which is a non-device forming surface to an upper surface of the spin base 21.

The rotating shaft 22 extends in a vertical direction along the rotation axis A1. An upper end portion of the rotating shaft 22 is coupled to a lower surface center of the spin base 21. A penetrating hole 21a which penetrates through the spin base 21 in an up/down direction is formed at a central region of the spin base 21 in a plan view. The penetrating hole 21a is communicatively connected with an internal space 22a of the rotating shaft 22.

The spin motor 23 applies a rotating force to the rotating shaft 22. The rotating shaft 22 is rotated by the spin motor 23 to rotate the spin base 21. Thereby, a substrate W is rotated around the rotation axis A1. In the following description, an inner side in a radius direction at the center of the rotation axis A1 shall be simply referred to as the "radially inner side" and an outer side in the radius direction at the center of the rotation axis A1 shall be simply referred to as "radially outer side." The spin motor 23 is included in the substrate rotating unit which rotates the substrate W around the rotation axis A1.

The facing member 6 is formed in a disk shape so as to have a diameter substantially equal to or larger than that of a substrate W and disposed substantially horizontally above the spin chuck 5. The facing member 6 is also referred to as a blocking member. The facing member 6 has a facing surface 6a which faces an upper surface of the substrate W. A hollow shaft 26 is fixed to a surface on the opposite side of the facing surface 6a of the facing member 6. A communication hole which is communicated with an internal space of the hollow shaft 26 and penetrates through the facing member 6 in the up/down direction is formed at a portion of the facing member 6 which includes a position that overlaps the rotation axis A1 in a plan view.

The processing unit 2 further includes a facing member raising/lowering unit 27 which drives raising/lowering of the facing member 6. The facing member raising/lowering unit 27 is able to position the facing member 6 at any given position (height) from a lower position (a position shown in FIG. 6K which will be described later) to an upper position (a position shown in FIG. 6A which will be described later). The lower position is a position at which the facing surface 6a of the facing member 6 comes closest to a substrate W in a movable range of the facing member 6. The upper position is a position at which the facing surface 6a of the facing member 6 is separated most from the substrate W in a movable range of the facing member 6. The facing member raising/lowering unit 27 includes, for example, a ball screw mechanism (not shown) and an electric motor (not shown) which applies a driving force thereto.

The processing cup 7 includes a plurality of guards 11 for receiving a liquid scattered outward from a substrate W held by the spin chuck 5, a plurality of cups 12 for receiving the liquid guided downward by the plurality of guards 11, and a cylindrical outer wall member 13 which surrounds the plurality of guards 11 and the plurality of cups 12. FIG. 2 shows an example in which there are provided three guards 11 (outer guard 11A, center guard 11B, inner guard 11C) and two cups 12 (first cup 12A, second cup 12B).

Where the outer guard 11A, the center guard 11B and the inner guard 11C are each referred, they may be hereinafter simply referred to as a guard 11 from time to time. Similarly, where the first cup 12A and the second cup 12B are each referred, they may be simply referred to as a cup 12 from time to time.

Each of the guards 11 surrounds a substrate W in a plan view and receives a liquid scattered from the substrate W. Each of the guards 11 includes a cylindrical tubular portion 14 which surrounds the spin chuck 5 and a circular-annular extension portion 15 which extends obliquely upward from an upper end of the tubular portion 14 toward the rotation axis A1 (facing member 6). The tubular portion 14 of the inner guard 11C, that of the center guard 11B and that of the outer guard 11A are disposed concentrically in this order from the radially inner side. The extension portion 15 of the inner guard 11C, that of the center guard 11B and that of the outer guard 11A overlap each other in this order from below in the up/down direction. An upper end of the extension portion 15 of the inner guard 11C corresponds to an upper end 11a of the inner guard 11C. An upper end of the extension portion 15 of the center guard 11B corresponds to an upper end 11a of the center guard 11B. An upper end of the extension portion 15 of the outer guard 11A corresponds to an upper end 11a of the outer guard 11A. The upper end 11a of each of the guards 11 surrounds the spin base 21 and the facing member 6 in a plan view.

The plurality of cups 12 are concentrically disposed sequentially from the first cup 12A to the second cup 12B from outside. The first cup 12A surrounds the spin chuck 5. The second cup 12B surrounds the spin chuck 5 further inside than the first cup 12A. The second cup 12B is disposed further below than the upper end of the outer wall member 13. The second cup 12B is fixed to the partition wall 24 of the chamber 4. The first cup 12A is formed integrally with the center guard 11B and moves up and down together with the center guard 11B. The center guard 11B may be able to move in relation to the first cup 12A.

The guard 11 is able to move up and down between the upper position and the lower position. When the guard 11 is positioned at the upper position, the upper end 11a of the guard 11 is positioned higher than an upper surface of a substrate W held by the spin chuck 5. When the guard 11 is positioned at the lower position, the upper end 11a of the guard 11 is positioned lower than the upper surface of the substrate W held by the spin chuck 5.

Figure 3:
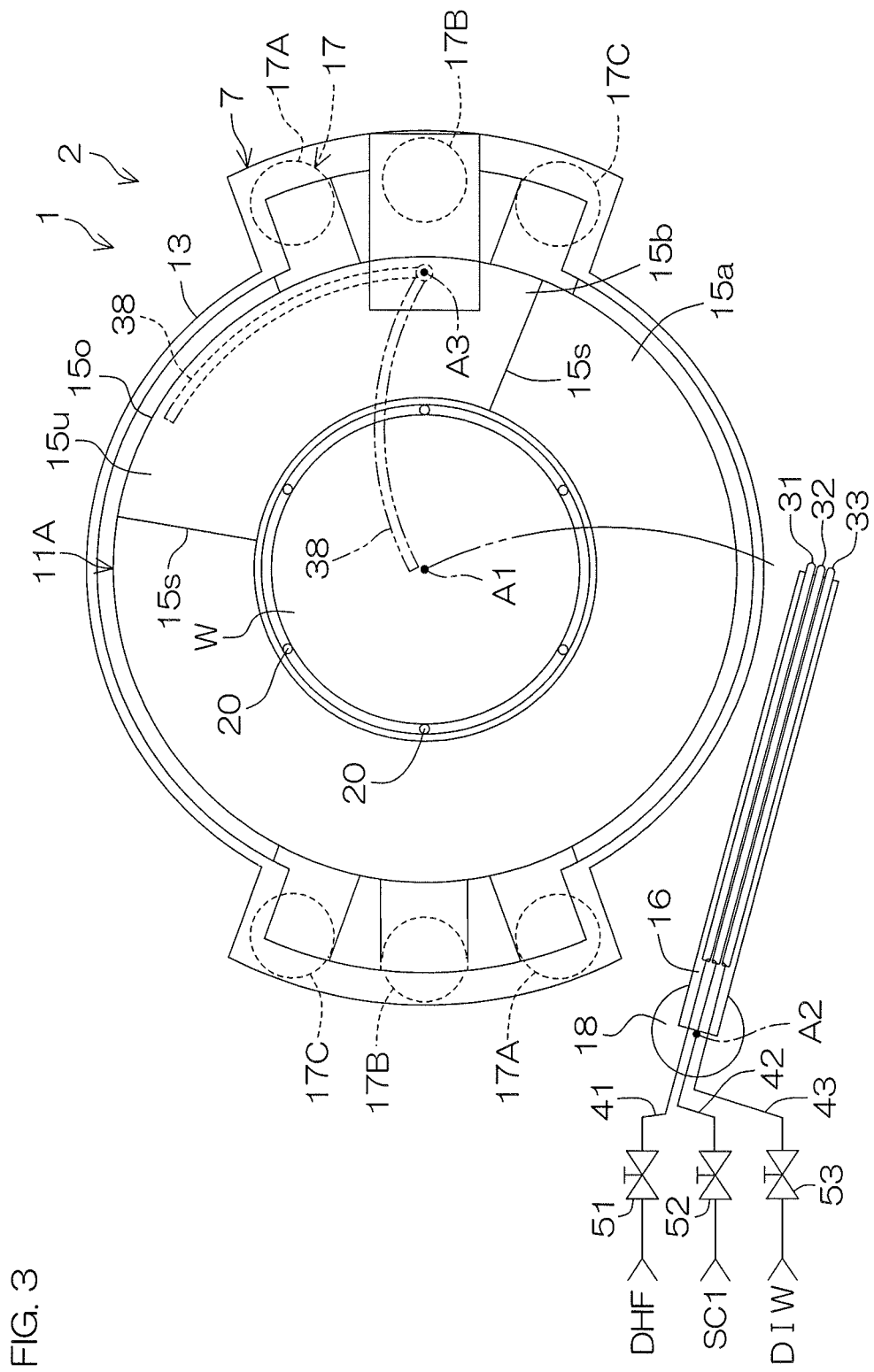
FIG. 3 is a plan view of a spin chuck and members around the spin chuck included in the processing unit.

The processing unit 2 further includes a guard raising/lowering unit 17 which drives raising/lowering of the plurality of guards 11. FIG. 3 is a plan view which shows the spin chuck 5 and members in the vicinity thereof. With reference to FIG. 3, the guard raising/lowering unit 17 includes a pair of outer guard raising/lowering units 17A, a pair of center guard raising/lowering units 17B and a pair of inner guard raising/lowering units 17C. In detail, a set composed of the outer guard raising/lowering unit 17A, the center guard raising/lowering unit 17B and the inner guard raising/lowering unit 17C is disposed in pairs so as to be point-symmetrical at the center of the rotation axis A1 of the substrate W in a plan view. It is, therefore, possible to stably raise and lower each of the plurality of guards 11.

Each of the outer guard raising/lowering units 17A includes an electric motor (not shown) which generates power and a ball screw mechanism which converts the rotation of the electric motor (not shown) to movement of the outer guard 11A in the up/down direction. Each of the center guard raising/lowering units 17B includes an electric motor (not shown) which generates power and a ball screw mechanism which converts the rotation of the electric motor (not shown) to movement of the center guard 11B in the up/down direction. Each of the inner guard raising/lowering units 17C includes an electric motor (not shown) which generates power and a ball screw mechanism which converts the rotation of the electric motor (not shown) to movement of the inner guard 11C in the up/down direction.

The guard raising/lowering unit 17 is an example of a guard switching unit which switches a state of the plurality of guards 11 by allowing at least one of the plurality of guards 11 to move up and down. The guard raising/lowering unit 17 positions each of the guards 11 at any given position from the upper position to the lower position. Thereby, a state (position) of the plurality of guards 11 is switched. The guard raising/lowering unit 17 sets the plurality of guards 11, for example, to anyone of three states (a first state, a second state and a third state).

The "first state" (a state shown in FIG. 6F which will be described later) is a state of the plurality of guards 11 when the outer guard 11A receives a liquid scattered from a substrate W. When a state of the plurality of guards 11 is the first state, the outer guard 11A is positioned at the upper position, and the inner guard 11C and the center guard 11B are positioned at the lower position.

The "second state" (a state shown in FIG. 6E which will be described later) is a state of the plurality of guards when the inner guard 11C receives a liquid scattered from a substrate W. When a state of the plurality of guards 11 is the second state, the outer guard 11A, the center guard 11B and the inner guard 11C are positioned at the upper position.

The "third state" (a state shown in FIG. 6A which will be described later) is a state of the plurality of guards when the center guard 11B receives a liquid scattered from a substrate W. When a state of the plurality of guards 11 is the third state, the outer guard 11A and the center guard 11B are positioned at the upper position, and the inner guard 11C is positioned at the lower position.

With reference to FIG. 2 and FIG. 3, the processing unit 2 includes a first chemical liquid nozzle 31 and a second chemical liquid nozzle 32, each of which discharges downward a chemical liquid toward an upper surface of a substrate W, and a first rinse liquid nozzle 33 which discharges a rinse liquid toward the upper surface of the substrate W.

The first chemical liquid nozzle 31 is connected to a first chemical liquid piping 41 which guides the chemical liquid. The second chemical liquid nozzle 32 is connected to a second chemical liquid piping 42 which guides the chemical liquid. The first rinse liquid nozzle 33 is connected to a first rinse liquid piping 43 which guides the rinse liquid. The rinse liquid is a liquid for washing away the chemical liquid. When a first chemical liquid valve 51 which is interposed in the first chemical liquid piping 41 is opened, the chemical liquid is continuously discharged downward from a discharge port of the first chemical liquid nozzle 31. The first chemical liquid nozzle 31 is an example of a chemical liquid supplying unit which supplies the chemical liquid to an upper surface of a substrate W. When a second chemical liquid valve 52 which is interposed in the second chemical liquid piping 42 is opened, the chemical liquid is continuously discharged downward from a discharge port of the second chemical liquid nozzle 32. The second chemical liquid nozzle 32 is also an example of the chemical liquid supplying unit. When a first rinse liquid valve 53 which is interposed in the first rinse liquid piping 43 is opened, the rinse liquid is continuously discharged downward from a discharge port of the first rinse liquid nozzle 33. The first rinse liquid nozzle 33 is an example of a rinse liquid supplying unit which supplies the rinse liquid to the upper surface of the substrate W.

The chemical liquid discharged from the first chemical liquid nozzle 31 is, for example, DHF (Diluted Hydrofluoric Acid). DHF is a solution prepared by diluting hydrofluoric acid. The chemical liquid discharged from the second chemical liquid nozzle 32 is, for example, SC1 (ammonia-hydrogen peroxide mixture).

The chemical liquid discharged from the first chemical liquid nozzle 31 and the chemical liquid discharged from the second chemical liquid nozzle 32 may be a liquid which contains at least one of sulfuric acid, acetic acid, nitric acid, hydrochloric acid, hydrofluoric acid, buffered hydrofluoric acid (BHF), DHF, ammonia water, hydrogen peroxide water, an organic acid (for example, citric acid, oxalic acid, etc.), an organic alkali (for example, TMAH: tetramethylammonium hydroxide, etc.), a surfactant and a corrosion inhibitor. As examples of a chemical liquid in which the above chemical liquids are mixed, SPM (sulfuric acid-hydrogen peroxide mixture), SC2 (hydrochloric acid-hydrogen peroxide mixture) can be cited in addition to SC1.

The rinse liquid discharged from the first rinse liquid nozzle 33 is, for example, carbonated water. The rinse liquid may be anyone of pure water (deionized water), electrolyzed water, hydrogen water, ozone water, ammonia water and aqueous hydrochloric acid solution of dilute concentration (of, for example, approximately 10 ppm to 100 ppm). The rinse liquid is water or an aqueous solution.

The first chemical liquid nozzle 31, the second chemical liquid nozzle 32 and the first rinse liquid nozzle 33 are each a scanning nozzle capable of moving inside the chamber 4. The processing unit 2 includes a nozzle arm 16 and a nozzle moving unit 18. The nozzle arm 16 holds the first chemical liquid nozzle 31, the second chemical liquid nozzle 32 and the first rinse liquid nozzle 33. The nozzle moving unit 18 allows the nozzle arm 16 to move, thereby allowing the first chemical liquid nozzle 31, the second chemical liquid nozzle 32 and the first rinse liquid nozzle 33 to move at least in the horizontal direction.

The nozzle moving unit 18 allows the first chemical liquid nozzle 31, the second chemical liquid nozzle 32 and the first rinse liquid nozzle 33 to move horizontally between a processing position (a position shown in FIG. 6A which will be described later) and a retracted position (a position shown in FIG. 3). When the first chemical liquid nozzle 31 is positioned at the processing position, the chemical liquid discharged from the first chemical liquid nozzle 31 lands on an upper surface of a substrate W. When the second chemical liquid nozzle 32 is positioned at the processing position, the chemical liquid discharged from the second chemical liquid nozzle 32 lands on the upper surface of the substrate W. When the first rinse liquid nozzle 33 is positioned at the processing position, the rinse liquid discharged from the first rinse liquid nozzle 33 lands on the upper surface of the substrate W. The first chemical liquid nozzle 31, the second chemical liquid nozzle 32 and the first rinse liquid nozzle 33 are positioned around the spin chuck 5 in a plan view, when they are positioned at the retracted position.

The nozzle moving unit 18 is, for example, a turning unit which allows the first chemical liquid nozzle 31, the second chemical liquid nozzle 32 and the first rinse liquid nozzle 33 to move horizontally around a nozzle pivoting axis A2. The nozzle pivoting axis A2 extends vertically around the spin chuck 5 and the processing cup 7.

The processing unit 2 includes a lower surface nozzle 34 which discharges a processing liquid above toward a lower surface central portion of a substrate W. The lower surface nozzle 34 is inserted into a penetrating hole 21a which is opened at an upper surface central portion of the spin base 21. A discharge port 34a of the lower surface nozzle 34 is exposed from the upper surface of the spin base 21. The discharge port of the lower surface nozzle 34 faces a lower surface central portion of the substrate W from below. The lower surface nozzle 34 is connected to a heating fluid piping 44 in which the heating fluid valve 54 is interposed.

When the heating fluid valve 54 is opened, a heating fluid such as warm water is supplied from the heating fluid piping 44 to the lower surface nozzle 34 and continuously discharged upward from the discharge port 34a of the lower surface nozzle 34. The lower surface nozzle 34 is an example of a heating fluid supplying unit which supplies a heating fluid to the lower surface of the substrate W. Warm water is water higher in temperature than a room temperature and, for example, water with temperatures of 80° C. to 85° C. The lower surface nozzle 34 is fixed to the partition wall 24 of the chamber 4. Even if the spin chuck 5 rotates the substrate W, the lower surface nozzle 34 will not rotate.

The heating fluid discharged from the lower surface nozzle 34 is not limited to warm water. The heating fluid discharged from the lower surface nozzle 34 suffices to be a fluid capable of heating a substrate W. The heating fluid discharged from the lower surface nozzle 34 may be, for example, high-temperature nitrogen gas. The heating fluid discharged from the lower surface nozzle 34 may be water vapor. If the heating fluid is water vapor, the substrate W can be heated by a fluid higher in temperature than warm water.

The processing unit 2 includes a central nozzle 60 which discharges downward a processing liquid via a central opening 6b which is opened at a central portion of the facing surface 6a of the facing member 6. The central nozzle 60 is disposed inside a penetrating hole which penetrates through a central portion of the facing member 6 in the up/down direction. A discharge port 60a of the central nozzle 60 is exposed from the central opening 6b and faces the center of the upper surface of the substrate W held by the spin chuck 5. The central nozzle 60 is raised and lowered in the vertical direction together with the facing member 6.

The central nozzle 60 includes a plurality of inner tubes (a first tube 35, a second tube 36, a third tube 37) which discharge a processing liquid downward and a tubular casing 61 which surround the plurality of inner tubes. The first tube 35, the second tube 36, the third tube 37 and the casing 61 extend in the up/down direction along the rotation axis A1. An inner circumferential surface of the facing member 6 surrounds an outer circumferential surface of the casing 61 at intervals in a radial direction (a direction orthogonal to the rotation axis A1). The discharge port 60a of the central nozzle 60 is also a discharge port of the first tube 35, the second tube 36 and the third tube 37.

The first tube 35 discharges a rinse liquid downward toward an upper surface of a substrate W. The first tube 35 is connected to a second rinse liquid piping 45 in which a second rinse liquid valve 55 is interposed. When the second rinse liquid valve 55 is opened, the rinse liquid is supplied from the second rinse liquid piping 45 to the first tube 35 and continuously discharged downward from a discharge port of the first tube 35 (the discharge port 60a of the central nozzle 60). The first tube 35 is an example of a rinse liquid supplying unit which supplies the rinse liquid to the upper surface of the substrate W. The rinse liquid discharged from the first tube 35 is, for example, carbonated water. The rinse liquid discharged from the first tube 35 is not limited to carbonated water. The rinse liquid discharged from the first tube 35 may be, for example, a rinse liquid such as DIW described previously.

The second tube 36 discharges a hydrophobic agent downward toward an upper surface of a substrate W. The hydrophobic agent is a liquid for hydrophobizing the upper surface of the substrate W. A surface tension acting on a pattern (refer to FIG. 9) on the upper surface of the substrate W which is hydrophobized by the hydrophobic agent is lower than a surface tension acting on a pattern on the upper surface of the substrate W which is not hydrophobized. The second tube 36 is connected to a hydrophobic agent piping 46 in which a hydrophobic agent valve 56 is interposed. When the hydrophobic agent valve 56 is opened, the rinse liquid is supplied from the hydrophobic agent piping 46 to the second tube 36 and continuously discharged downward from a discharge port of the second tube 36 (the discharge port 60a of the central nozzle 60). The second tube 36 is an example of a hydrophobic agent supplying unit which supplies the hydrophobic agent to the upper surface of the substrate W.

The hydrophobic agent discharged from the second tube 36 is, for example, a silicon-based hydrophobic agent which hydrophobizes silicon itself and a silicon-containing compound, or a metal-based hydrophobic agent which hydrophobizes a metal itself and a metal-containing compound. The metal-based hydrophobic agent includes at least one of amine with a hydrophobic group and an organic silicon compound. The silicon-based hydrophobic agent is, for example, a silane coupling agent.

The silane coupling agent includes at least any one of, for example, HMDS (hexamethyldisilazane), TMS (tetramethylsilane), fluorinated alkylchlorosilane, alkyldisilazane and a non-chloro hydrophobic agent. The non-chloro hydrophobic agent includes at least one of, for example, dimethylsilyldimethylamine, dimethylsilyldiethylamine, hexamethyldisilazane, tetramethyldisilazane, bis (dimethylamino) dimethylsilane, N, N-dimethylaminotrimethylsilane, N-(trimethylsilyl) dimethylamine and an organosilane compound.

The third tube 37 discharges downward toward an upper surface of a substrate W an organic solvent which is miscible with both a hydrophobic agent and a rinse liquid and also lower in surface tension than water. The liquid lower in surface tension than water is referred to as a low surface-tension liquid. The organic solvent discharged from the third tube 37 is, for example, isopropyl alcohol (IPA). The third tube 37 is connected to an organic solvent piping 47 in which an organic solvent valve 57 is interposed. When the organic solvent valve 57 is opened, IPA is supplied from the organic solvent piping 47 to the third tube 37 and continuously discharged downward from a discharge port of the third tube 37 (the discharge port 60a of the central nozzle 60). The third tube 37 is an example of an organic solvent supplying unit (low surface-tension liquid supplying unit) which supplies an organic solvent (low surface-tension liquid) to the upper surface of the substrate W.

The organic solvent discharged from the third tube 37 may be an organic solvent other than IPA, as long as it is miscible with both a hydrophobic agent and a rinse liquid and also lower in surface tension than water. More specifically, the organic solvent discharged from the third tube 37 may be an organic solvent of a liquid which contains at least one of IPA, HFE (hydrofluroether), methanol, ethanol, acetone, and Trans-1,2-dichloroehtylene.

The processing unit 2 includes a gas piping 49 which guides a gas from a gas supplying source to the central opening 6b of the facing member 6 and a gas valve 59 which is interposed in the gas piping 49. When the gas valve 59 is opened, the gas supplied from the gas piping 49 flows downward in a tubular gas flow passage 62 which is formed by an outer circumferential surface of the casing 61 of the central nozzle 60 and an inner circumferential surface of the facing member 6 and is discharged downward from the central opening 6b. The gas discharged from the central opening 6b is supplied to a space 90 between the facing surface 6a and an upper surface of a substrate W. The central opening 6b is included in a gas supplying unit which supplies the gas into the space 90. The opening degree of the gas valve 59 can be adjusted, thereby adjusting a flow rate (supply flow rate) of a gas discharged from the central opening 6b. The gas supplied to the central opening 6b is, for example, nitrogen gas. The gas supplied to the central opening 6b is lower in humidity than clean air supplied to an internal space of the chamber 4. Humidity of the clean air is, for example, from 47% to 50%. Humidity of the gas supplied to the central opening 6b is, for example, about 0%.

The gas supplied to the central opening 6b is preferably an inert gas. The inert gas is a gas which is inactive on an upper surface of a substrate W and in a pattern and may be a rare gas such as argon. The gas discharged from the central opening 6b may be air.

The processing unit 2 includes an internal nozzle 38 which discharges a processing liquid (for example, a hydrophobic agent) toward an upper surface of a substrate W. The internal nozzle 38 includes a horizontal portion 38h which is disposed lower than the upper end 11a of the outer guard 11A and a vertical portion 38v which is disposed above the outer guard 11A. When the outer guard 11A and the center guard 11B are positioned at any position, the horizontal portion 38h is disposed between the outer guard 11A and the center guard 11B. As shown in FIG. 3, the horizontal portion 38h has a circular arc shape in a plan view. The horizontal portion 38h may have a linear shape in a plan view or may have a polygonal line shape in a plan view.

As shown in FIG. 2, the internal nozzle 38 is inserted into a penetrating hole which penetrates through the extension portion 15 of the outer guard 11A in the up/down direction. The vertical portion 38v is disposed above the penetrating hole of the outer guard 11A. The vertical portion 38v penetrates in the up/down direction through a housing 70 disposed above the outer guard 11A. The housing 70 is supported by the outer guard 11A. The vertical portion 38v is rotatably supported by the housing 70. The internal nozzle 38 is able to pivot in relation to the outer guard 11A around a nozzle pivoting axis A3 which corresponds to a center line of the vertical portion 38v. The nozzle pivoting axis A3 is a vertical axis line which passes through the outer guard 11A.

A discharge port 38p which discharges a processing liquid downward is disposed at a leading end portion of the horizontal portion 38h (an end opposite to the nozzle pivoting axis A3). The internal nozzle 38 is connected to a second hydrophobic agent piping 48 in which a second hydrophobic agent valve 58 is interposed. When the second hydrophobic agent valve 58 is opened, a hydrophobic agent is supplied from the second hydrophobic agent piping 48 to the internal nozzle 38 and continuously discharged downward from the discharge port 38p of the internal nozzle 38.

The processing unit 2 includes a scanning unit 71 which pivots the internal nozzle 38 between the processing position and the retracted position around the nozzle pivoting axis A3. When the internal nozzle 38 is positioned at the processing position, the processing liquid discharged from the internal nozzle 38 lands on an upper surface of a substrate W. When positioned at the retracted position, the internal nozzle 38 is positioned around the spin chuck 5 in a plan view.

The scanning unit 71 includes an electric motor 72 which generates power for pivoting the internal nozzle 38. The electric motor 72 may be a coaxial motor which is coaxial to the vertical portion 38v of the internal nozzle 38 or may be coupled to the vertical portion 38v of the internal nozzle 38 via an endless belt.

When the internal nozzle 38 is positioned at the retracted position (a position shown by a dotted line in FIG. 3), the horizontal portion 38h of the internal nozzle 38 entirely overlaps the outer guard 11A. When the internal nozzle 38 is positioned at the processing position (a position shown by a double dotted & dashed line in FIG. 3), the leading end portion of the horizontal portion 38h is disposed further inside than the upper end 11a of the outer guard 11A, and the internal nozzle 38 overlaps a substrate W. The processing position includes a central processing position (a position shown by a double dotted & dashed line in FIG. 3) at which the processing liquid discharged from the internal nozzle 38 lands on an upper surface central portion of the substrate W and an outer circumferential processing position at which the processing liquid discharged from the internal nozzle 38 lands on an outer circumference portion of the upper surface of the substrate W.

The extension portion 15 of the outer guard 11A includes an annular inclined portion 15a extending obliquely from an upper end of the tubular portion 14 of the outer guard 11A toward the rotation axis A1 and a protrusion portion 15b protruding upward from the inclined portion 15a. The inclined portion 15a and the protrusion portion 15b are disposed side by side in a circumferential direction (a direction around the rotation axis A1). The protrusion portion 15b includes a pair of side walls 15s extending upward from the inclined portion 15a, an upper wall 15u disposed between upper ends of the pair of side walls 15s, and an outer wall 15o disposed between outer ends of the pair of side walls 15s. The protrusion portion 15b forms a housing space which is recessed above from a lower surface of the inclined portion 15a of the outer guard 11A.

When the internal nozzle 38 is positioned at the retracted position, the horizontal portion 38h of the internal nozzle 38 entirely overlaps the protrusion portion 15b in a plan view and is housed at the housing space. As shown in FIG. 2, at this time, the leading end portion of the horizontal portion 38h at which the discharge port 38p is provided is disposed further outside than the upper end 11a of the outer guard 11A. When the internal nozzle 38 is positioned at the retracted position, the upper end 11a of the outer guard 11A and the upper end 11a of the center guard 11B can be brought closer to each other in the up/down direction. It is, thereby, possible to reduce the amount of a liquid which enters between the outer guard 11A and the center guard 11B.

As described previously, the internal nozzle 38 is supported by the housing 70. Likewise, the scanning unit 71 is also supported by the housing 70. The electric motor 72 of the scanning unit 71 is disposed inside bellows 73 which is extendable in the up/down direction. The housing 70 is supported by the outer guard 11A via a first bracket 74A and supported by the guard raising/lowering unit 17 via a second bracket 74B. When the guard raising/lowering unit 17 raises and lowers the outer guard 11A, the housing 70 is also raised and lowered. Thereby, the internal nozzle 38 and the scanning unit 71 are also raised and lowered, together with the outer guard 11A.

Figure 4:
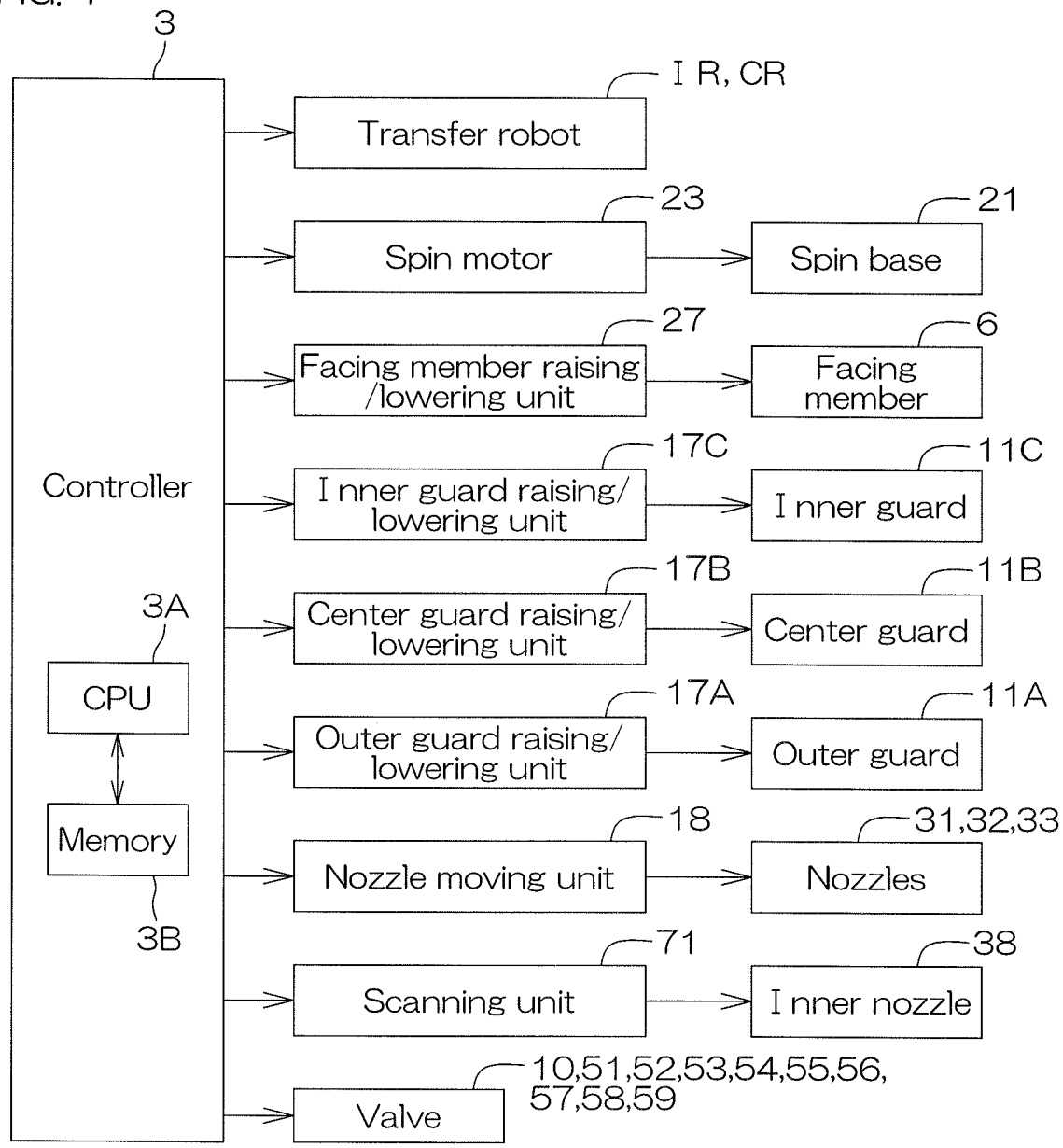
FIG. 4 is a block diagram for describing an electrical configuration of a main portion of the substrate processing apparatus.

FIG. 4 is a block diagram for describing an electrical configuration of main portions of the substrate processing apparatus 1. The controller 3 is provided with a microcomputer to control targets to be controlled which are provided in the substrate processing apparatus 1 according to predetermined programs. More specifically, the controller 3 includes a processor (CPU) 3A and a memory 3B in which programs are installed and is configured so as to execute various types of control for substrate processing according to programs executed by the processor 3A.

The controller 3 controls, in particular, motions of the transfer robots IR, CR, the spin motor 23, the facing member raising/lowering unit 27, the guard raising/lowering unit 17 (outer guard raising/lowering unit 17A, center guard raising/lowering unit 17B, inner guard raising/lowering unit 17C), the nozzle moving unit 18, valves 10, 51 to 59, etc. The valves 51 to 58 are controlled, thereby controlling a fluid discharged from corresponding nozzles (tubes) and a discharge flow rate thereof. The valve 59 is controlled, thereby controlling a gas discharged from the central opening 6b and a discharge flow rate thereof. The valve 10 is controlled, thereby controlling an evacuated gas from the evacuating duct 9 and an evacuation flow rate thereof.

Figure 5:
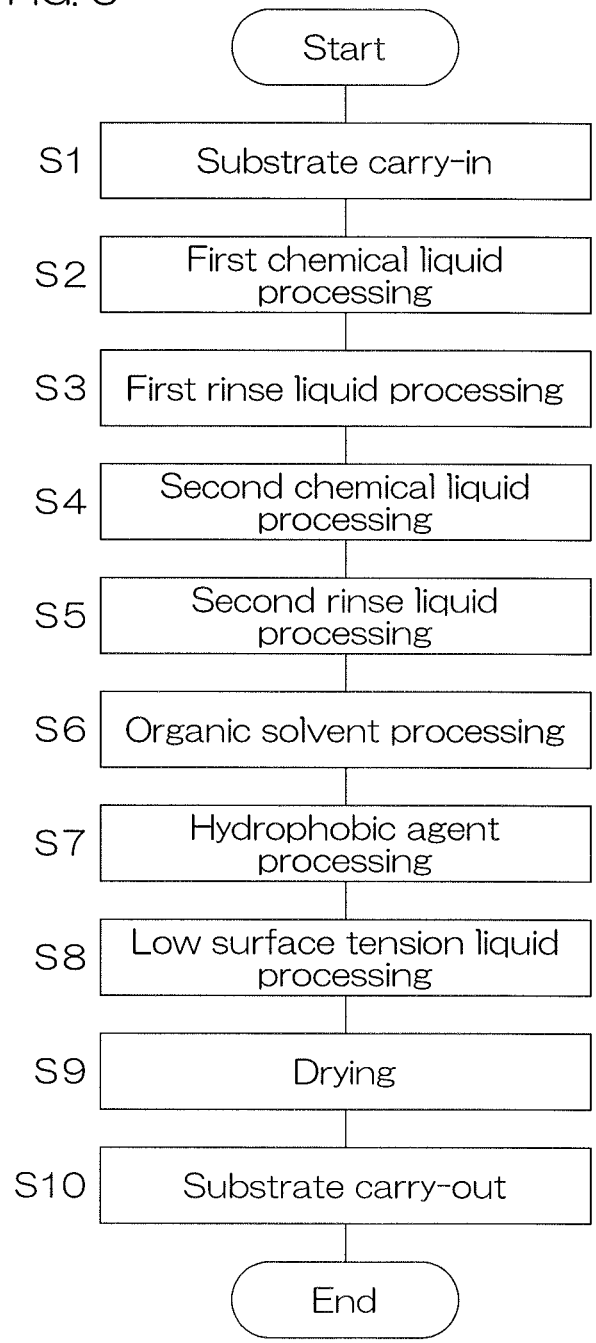
FIG. 5 is a flowchart for describing one example of substrate processing by the substrate processing apparatus.

FIG. 5 is a flowchart for describing an example of substrate processing by the substrate processing apparatus 1, mainly showing the processing performed according to programs executed by the controller 3. FIG. 6A to FIG. 6K are each an illustrative sectional view for describing an example of the substrate processing. FIG. 7 is a timechart for describing an example of the substrate processing.

In the substrate processing by the substrate processing apparatus 1, for example, as shown in FIG. 5, the following are executed in order given below, namely, substrate carry-in (S1), first chemical liquid processing (S2), first rinse liquid processing (S3), second chemical liquid processing (S4), second rinse liquid processing (S5), organic solvent processing (S6), hydrophobic agent processing (S7), low surface-tension liquid processing (S8), drying processing (S9) and substrate carry-out (S10).

First, with reference to FIG. 1, in the substrate processing by the substrate processing apparatus 1, a substrate W is carried in the processing unit 2 from the carrier C by the transfer robots IR, CR and delivered to the spin chuck 5 (Step S1: substrate carry-in). In the substrate processing by the substrate processing apparatus 1, the evacuating valve 10

(refer to FIG. 2) is constantly opened and the opening degree of the evacuating valve 10 is kept constant.

Figure 6A:
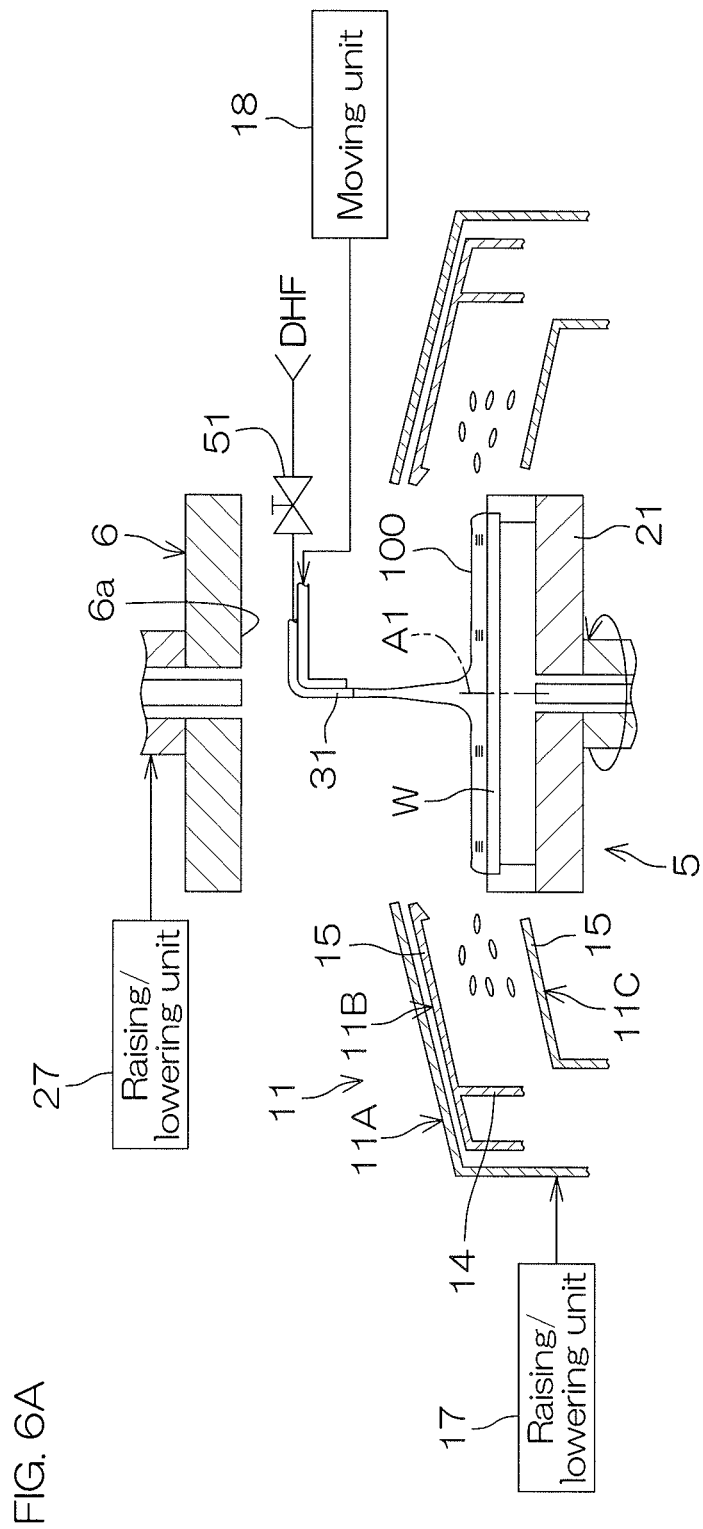
Figure 7:
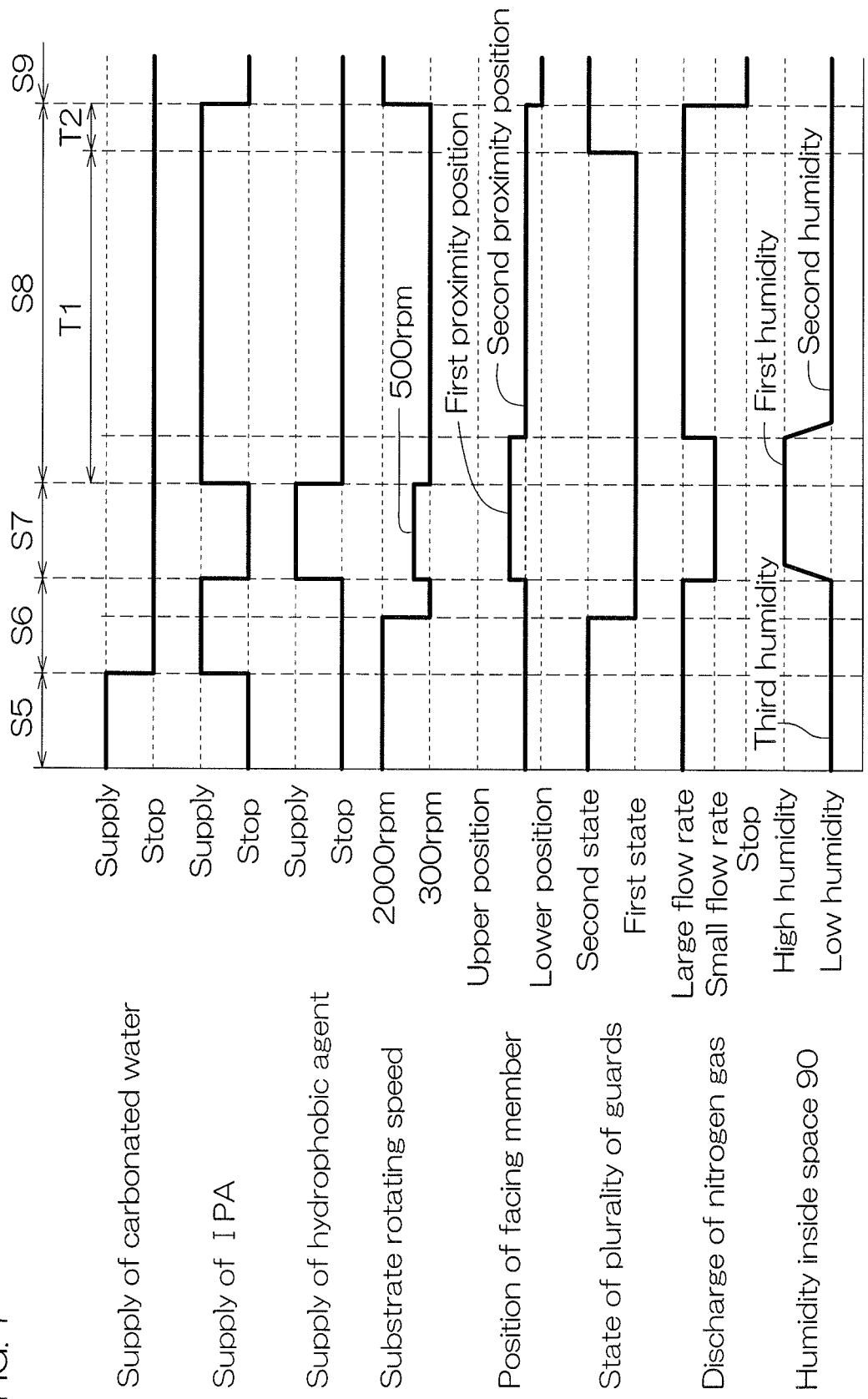
FIG. 7 is a timechart for describing one example of the substrate processing.
Figure 8A:
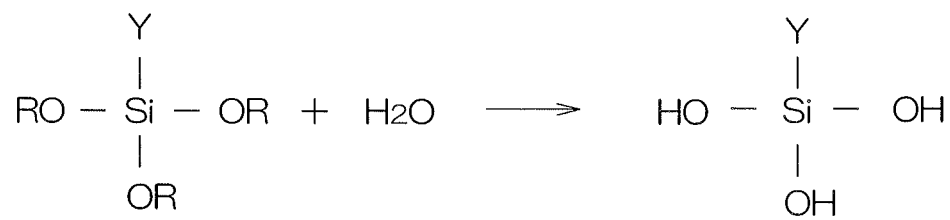
FIG. 8A is a drawing for describing reactions of water with a hydrophobic agent.
Figure 8B:
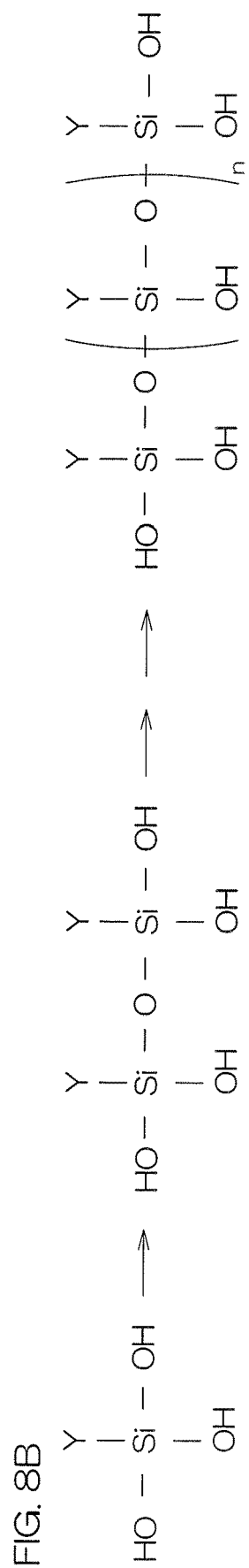
FIG. 8B is a drawing for describing a polymerization reaction of the hydrophobic agent.
Figure 8C:
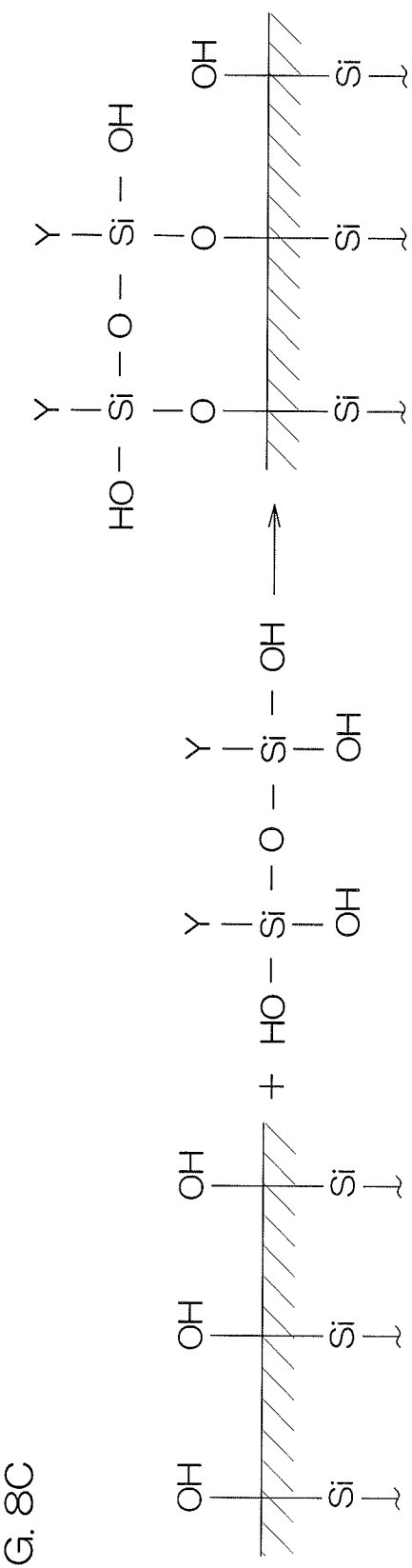
FIG. 8C is a drawing for describing reactions of the hydrophobic agent with a front surface of a substrate.

Then, with reference to FIG. 6A, until being carried out by the transfer robot CR, the substrate W is held horizontally by the spin chuck 5 at a position surrounded by the plurality of guards 11 (substrate holding step). Then, the spin motor 23 (refer to FIG. 2) starts to rotate the spin base 21. Thereby, rotation of the substrate W is started (substrate rotating step). Then, the facing member raising/lowering unit 27 positions the facing member 6 at the upper position.

Then, the first chemical liquid processing (S2) is started. In the first chemical liquid processing (S2), DHF (Diluted Hydrofluoric Acid) is supplied as a chemical liquid to the substrate W.

Specifically, the guard raising/lowering unit 17 switches a state of the plurality of guards 11 to the third state. Then, the nozzle moving unit 18 moves the first chemical liquid nozzle 31, the second chemical liquid nozzle 32 and the first rinse liquid nozzle 33 to the processing position. Then, the first chemical liquid valve 51 is opened. Thereby, DHF (chemical liquid) is supplied from the first chemical liquid nozzle 31 to a central region of the upper surface of the substrate W in a rotating state (chemical liquid supplying step). DHF spreads across an entirety of the upper surface of the substrate W due to a centrifugal force. Thereby, a liquid film 100 of DHF is formed on the substrate W. DHF is scattered from the substrate W in the radially outer side due to a centrifugal force. The liquid scattered from the substrate W passes between the extension portion 15 of the center guard 11B and the extension portion 15 of the inner guard 11C and is received by the tubular portion 14 of the center guard 11B.

Next, the first rinse liquid processing (S3) is executed. In the first rinse liquid processing (S3), DHF on the substrate W is washed away by DIW.

Figure 6B:
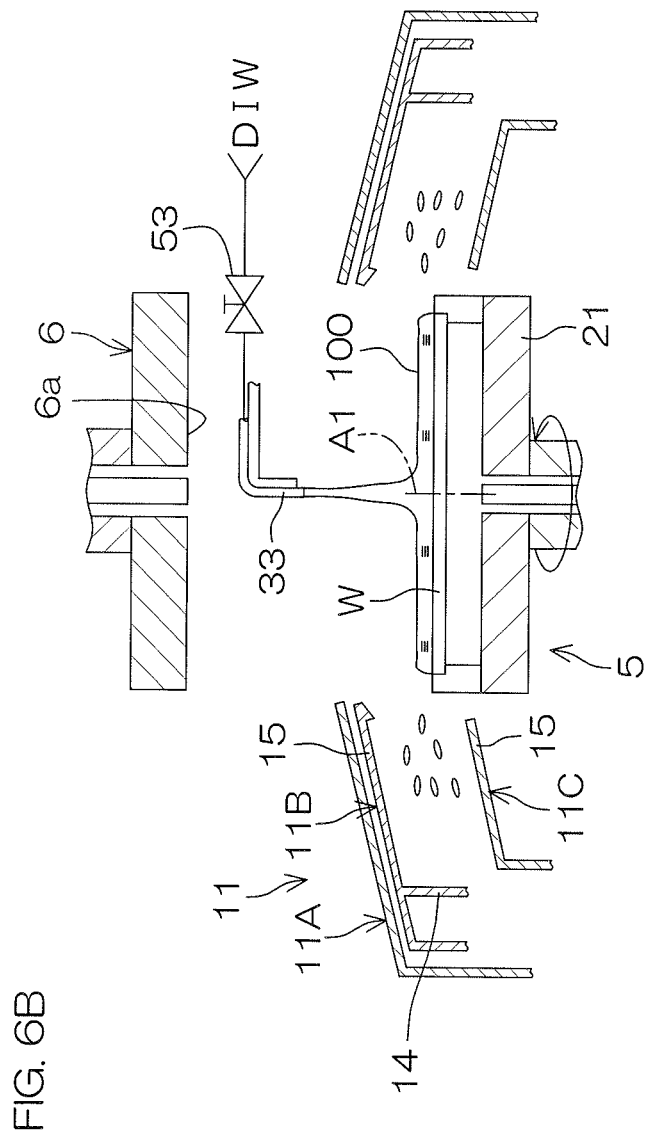

Specifically, the first chemical liquid valve 51 is closed. Thereby, discharge of DHF from the first chemical liquid nozzle 31 is stopped. Then, as shown in FIG. 6B, the first rinse liquid valve 53 is opened. Thereby, DIW (rinse liquid) is supplied from the first rinse liquid nozzle 33 toward a central region of the upper surface of the substrate W in the rotating state (rinse liquid supplying step). DIW spreads across the entirety of the upper surface of the substrate W due to a centrifugal force. Thereby, DHF inside the liquid film 100 on the substrate W is replaced by DIW. A mixture solution of DHF with DIW and DIW are scattered to the radially outer side from the substrate W due to a centrifugal force. The liquid scattered from the substrate W passes between the extension portion 15 of the center guard 111B and the extension portion 15 of the inner guard 11C and is received by the tubular portion 14 of the center guard 11B.

Next, the second chemical liquid processing (S4) is executed. In the second chemical liquid processing (S4), SC1 is supplied to the upper surface of the substrate W.

Figure 6C:
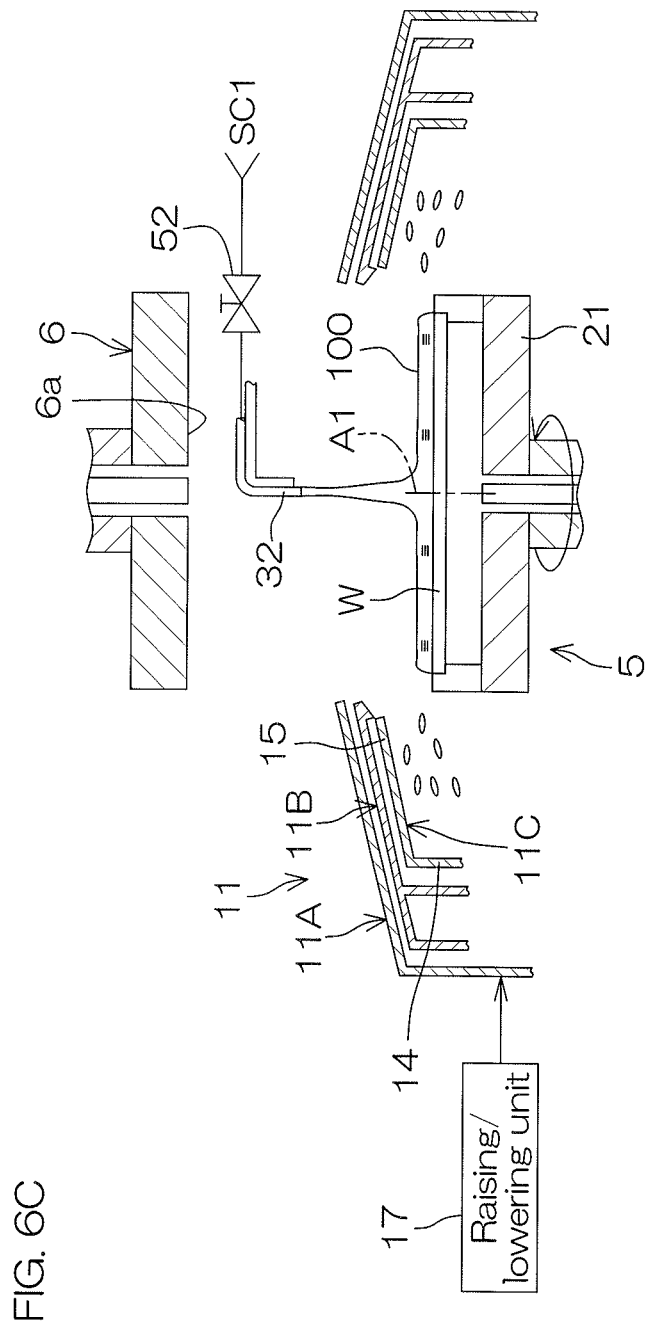

Specifically, the first rinse liquid valve 53 is closed. Thereby, discharge of DIW from the first rinse liquid nozzle 33 is stopped. Then, as shown in FIG. 6C, the guard raising/lowering unit 17 switches a state of the plurality of guards 11 from the third state to the second state. Specifically, the plurality of guards 11 are made into a state in which the liquid scattered from substrate W is received by the inner guard 11C.

Then, the second chemical liquid valve 52 is opened. Thereby, SC1 is discharged (supplied) from the second chemical liquid nozzle 32 toward a central region of the upper surface of the substrate W in the rotating state (chemical liquid supplying step). The chemical liquid spreads across the entirety of the upper surface of the substrate W due to a centrifugal force. Thereby, DIW inside the liquid film 100 on the substrate W is replaced by SC1. Then, the upper surface of the substrate W is processed by SC1. A mixture solution of SC1 with DIW and SC1 are scattered from the substrate W to the radially outer side due to a centrifugal force. The liquid scattered from the substrate W passes below the extension portion 15 of the inner guard 11C and is received by the tubular portion 14 of the inner guard 11C.

Next, the second rinse liquid processing (S5) is executed. In the second rinse liquid processing (S5), SC1 on the substrate W is washed away by carbonated water.

Figure 6D:
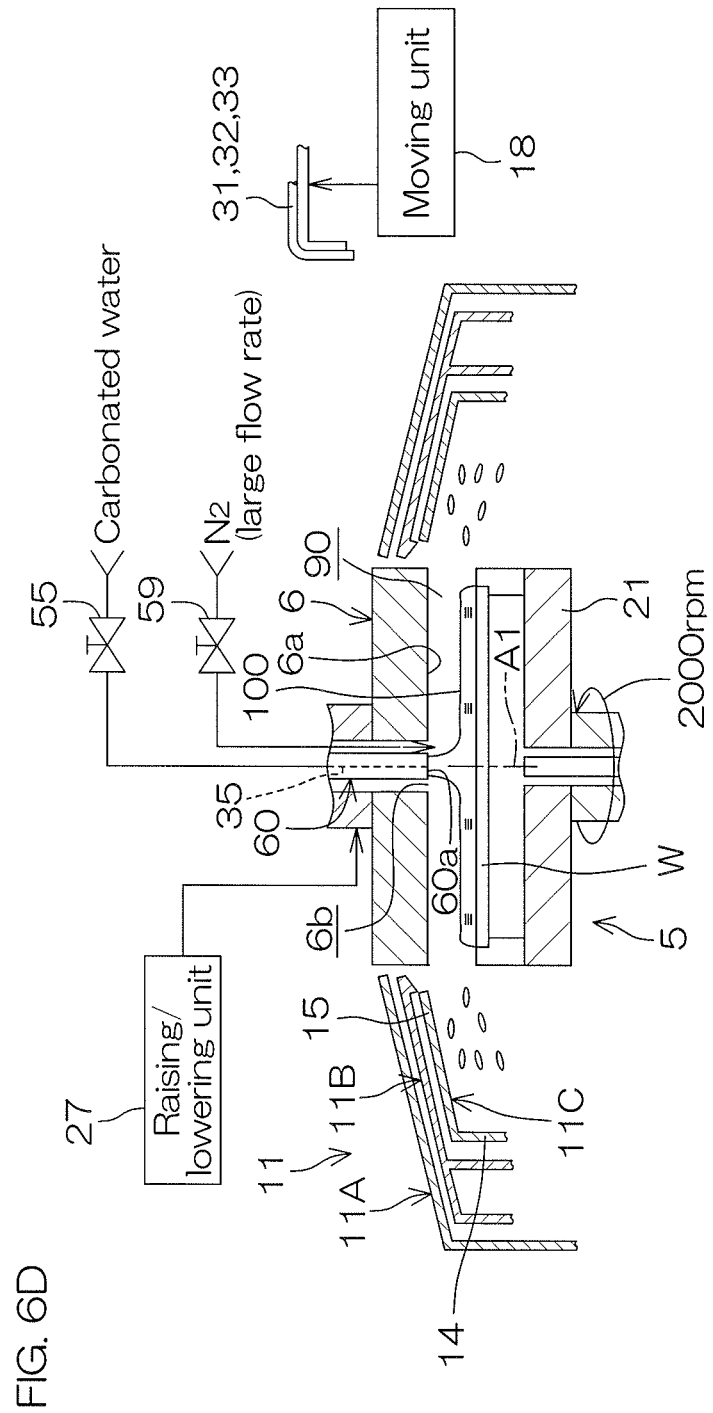

Specifically, with reference to FIG. 6D and FIG. 7, the second chemical liquid valve 52 is closed. Thereby, discharge of SC1 from the second chemical liquid nozzle 32 is stopped. Then, the nozzle moving unit 18 positions the first chemical liquid nozzle 31, the second chemical liquid nozzle 32 and the first rinse liquid nozzle 33 at the retracted position.

Then, the facing member raising/lowering unit 27 positions the facing member 6 at a proximity position between the upper position and the lower position. In this substrate processing, the proximity distance includes a first proximity position (a position shown in FIG. 6G which will be described later) and a second proximity position (a position shown in FIG. 6D) which is separated further from the upper surface of the substrate W than the first proximity position. A distance between the lower surface of the facing member 6 positioned at the first proximity position and the upper surface of the substrate W is referred to as a first distance. The first distance is, for example, 15 mm. A distance between the lower surface of the facing member 6 positioned at the second proximity position and the upper surface of the substrate W is referred to as a second distance. The second distance is, for example, 5 mm. In the second rinse liquid processing, the facing member 6 is positioned at the second proximity position.

Here, if the upper end 11a of at least one of the guards 11 is positioned at a height position equal to the facing surface 6a of the facing member 6 or higher than the facing surface 6a of the facing member 6, it is possible to enhance the degree of sealing of the space 90 between the upper surface of the substrate W and the facing surface 6a of the facing member 6. In a state that the plurality of guards 11 are positioned at the upper position and the facing member 6 is also positioned at the first proximity position, the upper ends 11a of the plurality of guards 11 are positioned higher than the facing surface 6a. Therefore, the space 90 is enhanced in degree of sealing (sealing step).

In a state that the space 90 is enhanced in degree of sealing, the gas valve 59 is opened. Thereby, the nitrogen gas discharged from the central opening 6b of the facing member 6 starts to be supplied to an interior of the space 90 (gas supplying step, inert gas supplying step). Further, the evacuating valve 10 (refer to FIG. 2) is kept opened. Therefore, the atmosphere (atmosphere in the vicinity of the upper surface of the substrate W) in the space 90 is evacuated (evacuating step). Therefore, replacement of air inside the space 90 is started, thereby starting adjustment of humidity of the atmosphere inside the space 90. Specifically, the humidity inside the space 90 starts to change so as to be close to the humidity of nitrogen gas discharged from the central opening 6b of the facing member 6. In the second rinse liquid processing, a flow rate (discharge flow rate) of nitrogen gas discharged from the central opening 6b of the facing member 6 is a relatively large flow rate. In the second rinse liquid processing, a discharge flow rate of nitrogen gas is, for example, 50 L/min.

Then, the second rinse liquid valve 55 is opened. Thereby, carbonated water (rinse liquid) is discharged (supplied) from the discharge port 60*a* of the first tube 35 of the central nozzle 60 toward a central region of the upper surface of the substrate W in the rotating state (rinse liquid supplying step). A flow rate (discharge flow rate) of carbonated water discharged from the first tube 35 is, for example, 2000 mL/min. The carbonated water spreads across the entirety of the upper surface of the substrate W due to a centrifugal force. Thereby, SC1 inside a liquid film 100 on the substrate W is replaced by the carbonated water.

A mixture of SC1 with carbonated water and carbonated water are scattered from the substrate W to the radially outer side due to a centrifugal force. A state of the plurality of guards 11 is kept at the same second state as the second chemical liquid processing (S4). Therefore, the liquid scattered from the substrate W passes further below than the extension portion 15 of the inner guard 11C and is received by the tubular portion 14 of the center guard 11B. In the second rinse liquid processing, the spin motor 23 rotates the substrate W at 2000 rpm.

After the elapse of a predetermined time (for example, 15 seconds) from start of supply of carbonated water to the upper surface of the substrate W, the organic solvent processing (S6) is executed. In the organic solvent processing (S6), carbonated water (rinse liquid) on the upper surface of the substrate W is replaced by IPA (organic solvent).

Figure 6E:
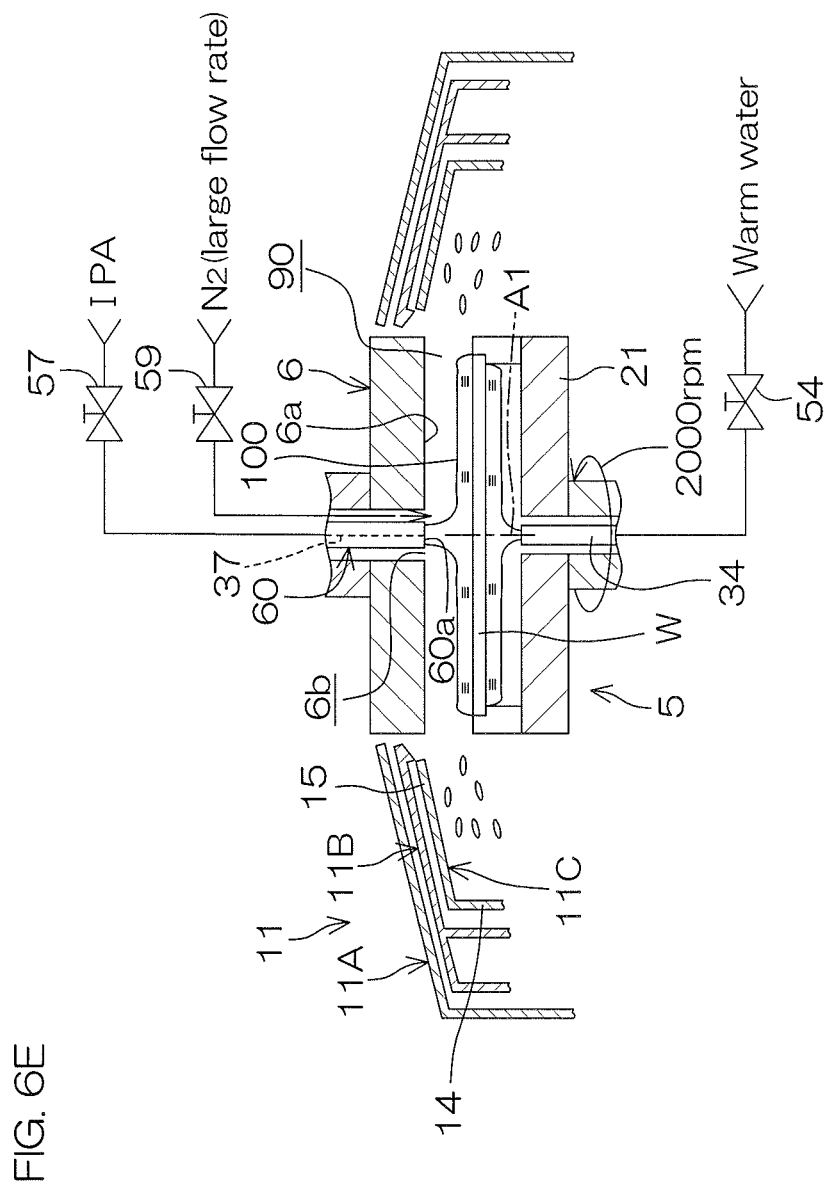

Specifically, with reference to FIG. 6E and FIG. 7, the second rinse liquid valve 55 is closed. Thereby, discharge of carbonated water from the first tube 35 is stopped. Then, the organic solvent valve 57 is opened. Thereby, IPA (organic solvent) is discharged (supplied) from the discharge port 60*a* of the third tube 37 of the central nozzle 60 toward a central region of the upper surface of the substrate W in the rotating state (organic solvent supplying step). A flow rate (discharge flow rate) of IPA discharged from the third tube 37 is, for example, 300 mL/min. IPA spreads across the entirety of the upper surface of the substrate W due to a centrifugal force. Since IPA is miscible with carbonated water, carbonated water inside the liquid film 100 on the substrate W is replaced by IPA. A mixture of carbonated water with IPA and IPA are scattered from the substrate W to the radially outer side due to a centrifugal force.

A state of the plurality of guards 11 is kept at the same second state as with the second rinse liquid processing (S5). Therefore, the liquid scattered from the substrate W is received by the tubular portion 14 of the inner guard 11C. A position of the facing member 6 is kept at the same first proximity position as with the second rinse liquid processing (S5).

Then, a heating fluid valve 54 is opened. Thereby, warm water (heating fluid) is discharged from the lower surface nozzle 34 toward a central region of the lower surface of the substrate W. Thereby, a heating fluid supplying step is started and heating of the substrate W is started (substrate heating step). Thus, the lower surface nozzle 34 functions as a substrate heating unit for heating the substrate W. The heating fluid supplying step is executed in parallel with the organic solvent supplying step. The rotating speed of the substrate W is kept at the same speed (2000 rpm) as with the second rinse liquid processing (S5). The discharge flow rate of nitrogen gas discharged from the central opening 6*b* of the facing member 6 is also kept at the large flow rate.

Figure 6F:
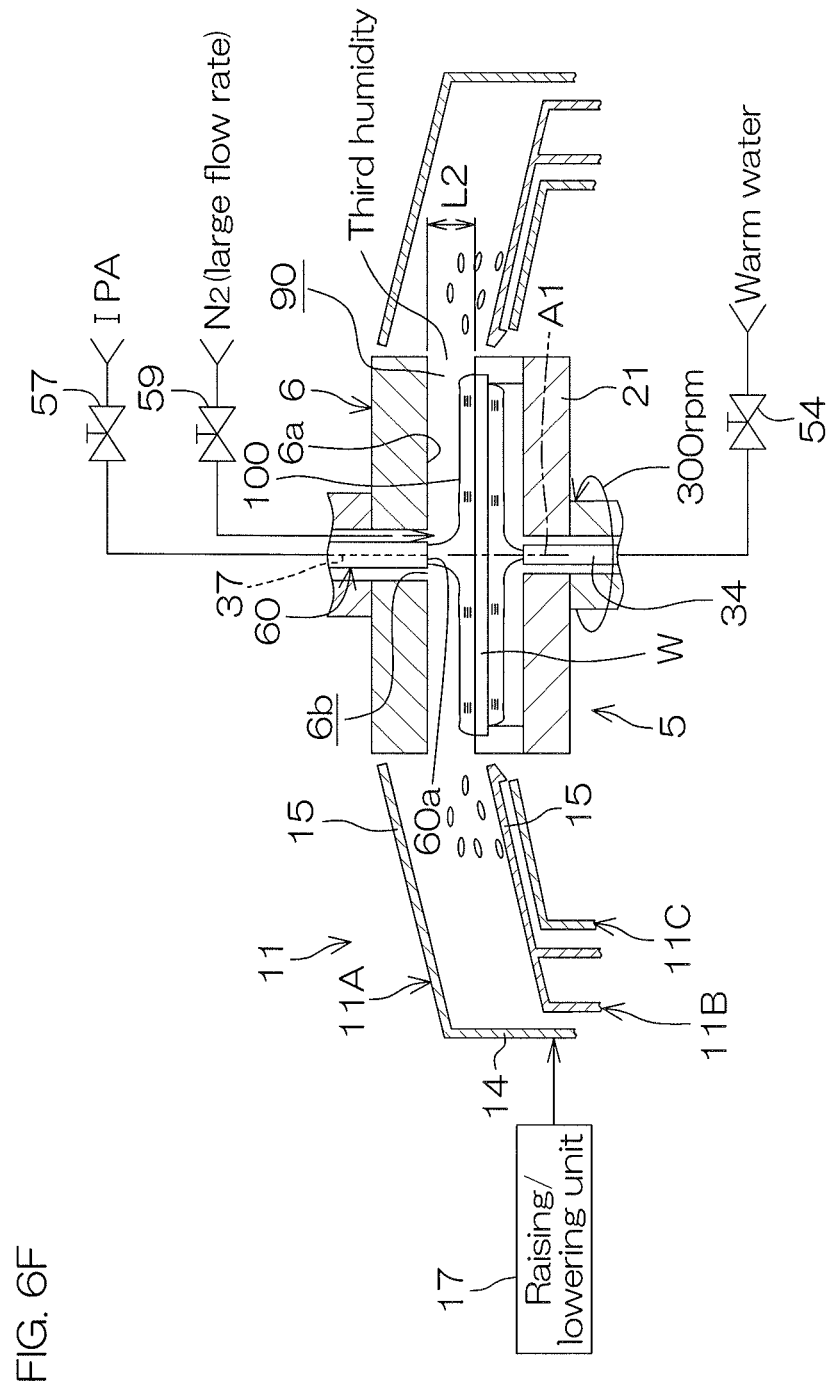

After the elapse of a predetermined time (for example, 9 seconds) from start of discharge of IPA from the third tube 37, as shown in FIG. 6F, the guard raising/lowering unit 17 switches a state of the plurality of guards 11 from a second state to a first state (first guard switching step). During execution of the first guard switching step, at least the upper end 11*a* of the outer guard 11A is positioned higher than the facing surface 6*a*. That is, even during execution of the first guard switching step, the sealing step is being executed. Further, a rotating speed of the substrate W is changed from 2000 rpm to 300 rpm.

After the elapse of a predetermined time (for example, 6 seconds) from a change in position of the plurality of guards 11, the hydrophobic agent processing (S7) is started. In the hydrophobic agent processing (S7), the upper surface of the substrate W is hydrophobized by a hydrophobic agent.

Figure 6G:
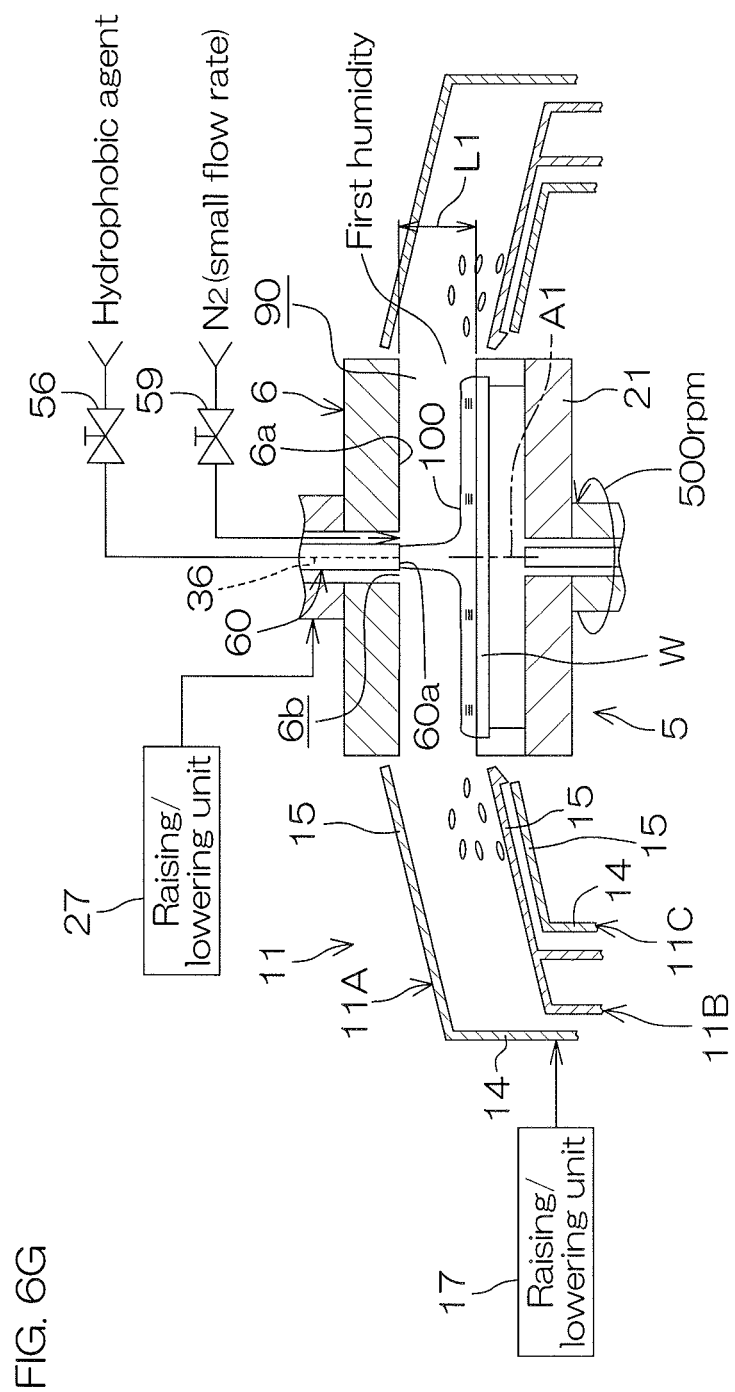

Specifically, with reference to FIG. 6G and FIG. 7, the organic solvent valve 57 is closed. Thereby, discharge of an organic solvent from the third tube 37 is stopped. Then, the hydrophobic agent valve 56 is opened. Thereby, a hydrophobic agent is discharged (supplied) from the discharge port 60*a* of the second tube 36 of the central nozzle 60 toward a central region of the upper surface of the substrate W in the rotating state (hydrophobic agent supplying step). A flow rate (discharge flow rate) of the hydrophobic agent discharged from the second tube 36 is, for example, 150 mL/min. The hydrophobic agent spreads across the entirety of the upper surface of the substrate W due to a centrifugal force. Since IPA is miscible with the hydrophobic agent, IPA inside the liquid film 100 on the substrate W is replaced by the hydrophobic agent. A mixture of IPA with the hydrophobic agent and the hydrophobic agent are scattered from the substrate W to the radially outer side due to a centrifugal force.

A state of the plurality of guards 11 is kept at the first state. Therefore, the liquid scattered from the substrate W passes between the extension portion 15 (first extension portion) of the outer guard 11A (first guard) and the extension portion 15 (second extension portion) of the inner guard 11C (second guard) and is received by the tubular portion 14 (first tubular portion) of the outer guard 11A. Strictly speaking, the liquid scattered from the substrate W passes between the extension portion 15 of the outer guard 11A and the extension portion 15 of the center guard 11B. The rotating speed of the substrate W is changed from 300 rpm to 500 rpm. Then, the opening degree of the gas valve 59 is adjusted and a discharge flow rate of nitrogen gas is changed to a relatively small flow rate (for example, 10 L/min).

Then, the facing member raising/lowering unit 27 moves the facing member 6 to the first proximity position which is positioned higher than the second proximity position. In a state that the outer guard 11A is positioned at the upper position and the facing member 6 is also positioned at the first proximity position, the upper end 11*a* of the outer guard 11A is positioned higher than the facing surface 6*a*. Therefore, there is kept a state that the space 90 is enhanced in degree of sealing. Further, evacuation of the atmosphere inside the space 90 by the evacuating unit 8 is continued even after the first guard switching step.

The facing member 6 is moved from the second proximity position to the first proximity position at the same time when supply of a hydrophobic agent is started. Timing when the facing member 6 is moved from the second proximity position to the first proximity position may be slightly earlier than the start of supply of the hydrophobic agent or may be slightly later than the start of supply of the hydrophobic agent.

After the elapse of a predetermined time (for example, 15 seconds) from start of discharge of the hydrophobic agent, the low surface-tension liquid processing (S8) is started. In the low surface-tension liquid processing (S8), the hydrophobic agent on the upper surface of the substrate W is replaced by IPA.

Figure 6H:
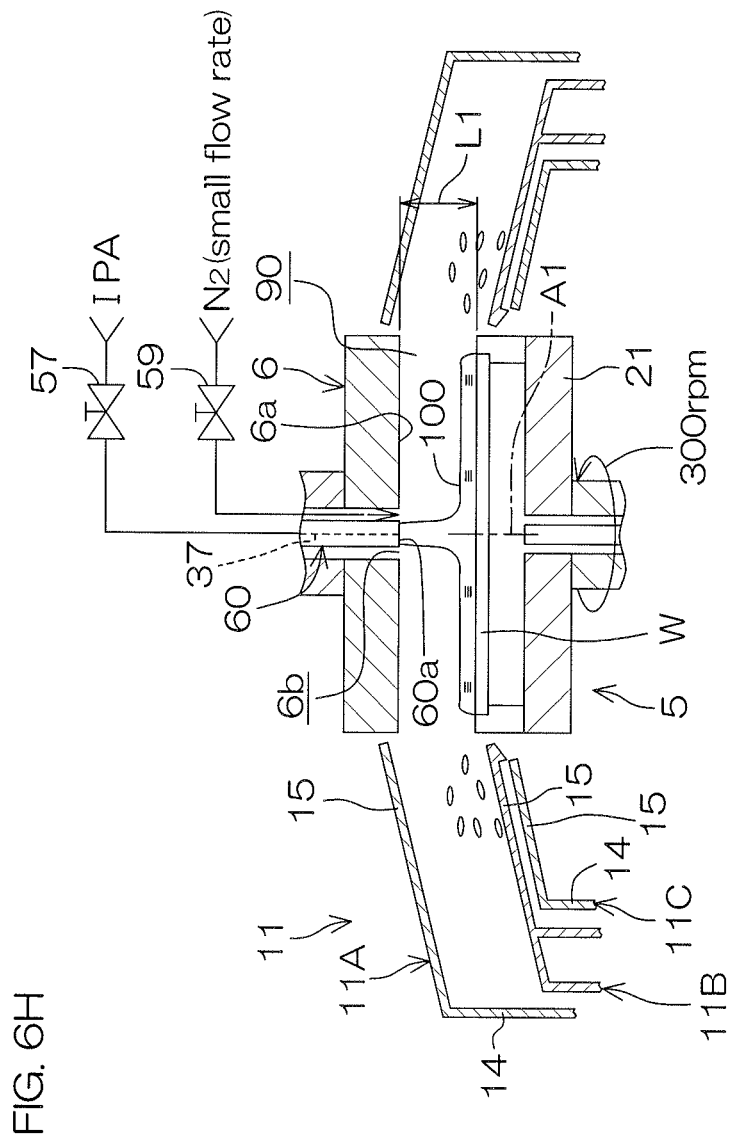

Specifically, with reference to FIG. 6H and FIG. 7, the hydrophobic agent valve 56 is closed. Thereby, discharge of the hydrophobic agent from the second tube 36 is stopped. Then, the organic solvent valve 57 is opened. Thereby, IPA (low surface-tension liquid) is discharged (supplied) from the discharge port 60a of the third tube 37 of the central nozzle 60 toward a central region of the upper surface of the substrate W in the rotating state (low surface-tension liquid supplying step). A discharge flow rate of IPA in the low surface-tension liquid supplying step is the same as that in the organic solvent supplying step and, for example, 300 mL/min. IPA spreads across the entirety of the upper surface of the substrate W due to a centrifugal force. Thereby, the hydrophobic agent inside the liquid film 100 on the substrate W is replaced by IPA.

A mixture of IPA with hydrophobic agent is scattered from the substrate W to the radially outer side due to a centrifugal force. A state of the plurality of guards 11 is kept at the first state. In other words, the first guard switching step is executed before start of the low surface-tension liquid supplying step. Therefore, the liquid scattered from the substrate W is received by the tubular portion 14 of the outer guard 11A.

The rotating speed of the substrate W is changed from 500 rpm to 300 rpm. In the low surface-tension liquid processing (S8), the rotating speed of the substrate W is kept at 300 rpm.

Figure 6I:
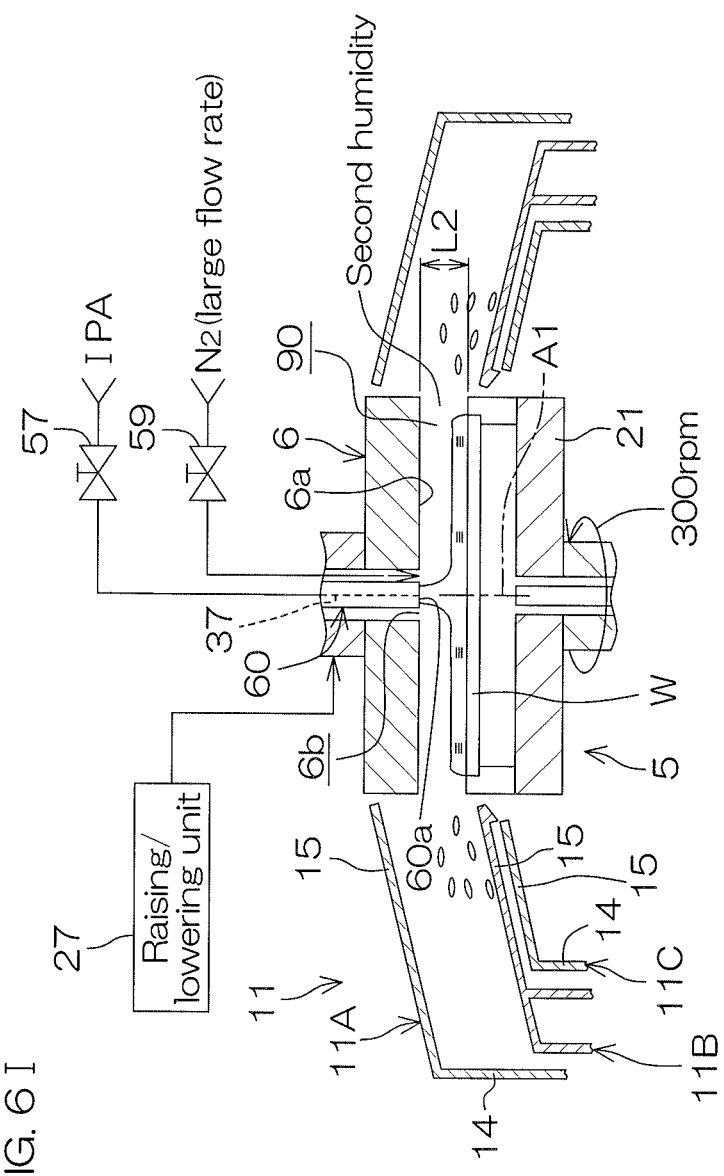

As shown in FIG. 6I, after the elapse of a predetermined time (for example, 10 seconds) from start of discharge of IPA, the facing member raising/lowering unit 27 moves the facing member 6 from the first proximity position to the second proximity position. In other words, during execution of the low surface-tension liquid supplying step, a distance between the facing surface 6a and the upper surface of the substrate W is changed from a first distance L1 to a second distance L2. In a state that the outer guard 11A is positioned at the upper position and also the facing member 6 is positioned at the second proximity position, the upper end 11a of the outer guard 11A is positioned higher than the facing surface 6a. Therefore, there is kept a state that the space 90 is enhanced in degree of sealing. Then, the opening degree of the gas valve 58 is adjusted and a discharge flow rate of nitrogen gas is changed to a relatively large flow rate (for example, 50 L/min).

Figure 6J:
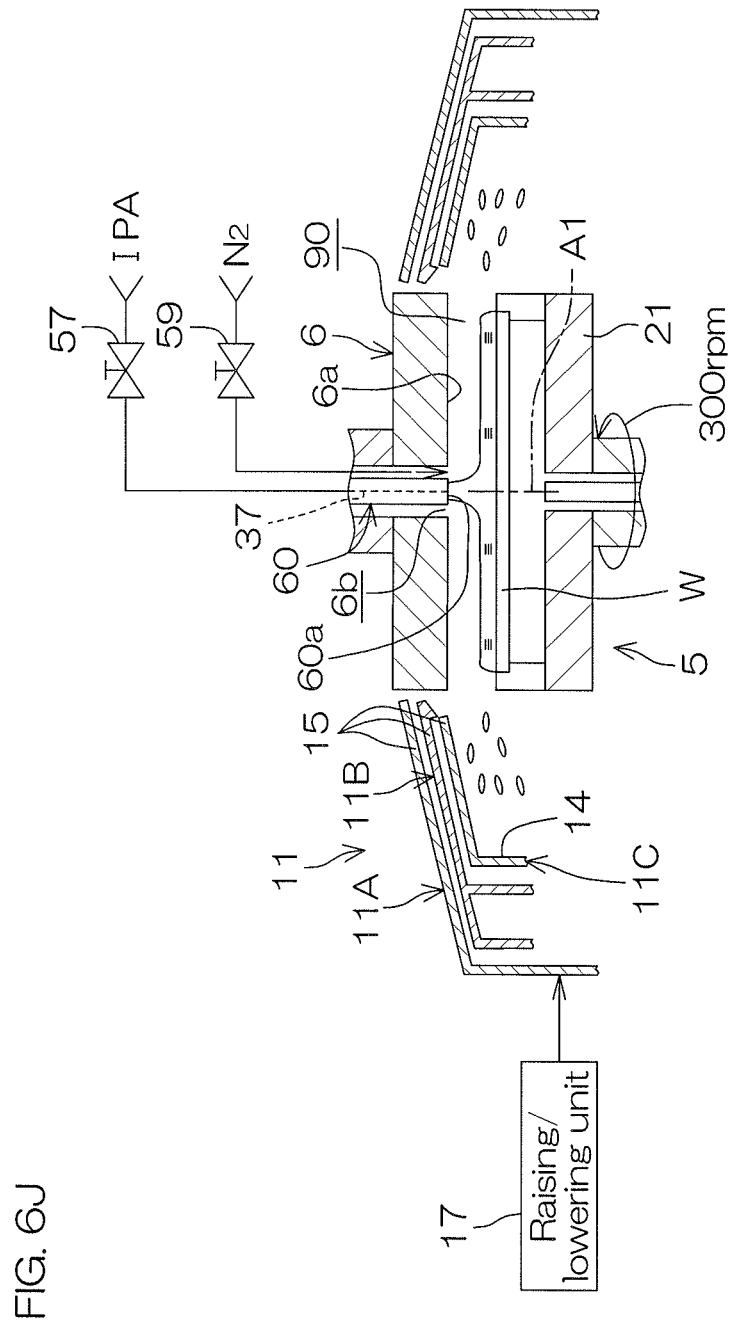

After the elapse of a predetermined time (for example, 40 seconds) from movement of the facing member 6 to the first proximity position, as shown in FIG. 6J, the guard raising/lowering unit 17 switches a state of the plurality of guards 11 from the first state to the second state (second guard switching step). The second guard switching step is executed while IPA is discharged from the third tube 37 (during execution of low surface-tension liquid supplying step). It is preferable that the state of the plurality of guards 11 is switched from the first state to the second state such that time T1 during which the liquid scattered from the substrate W is received by the outer guard 11A in the low surface-tension liquid supplying step is made longer than time T2 during which the liquid scattered from the substrate W is received by the inner guard 11C in the low surface-tension liquid supplying step (refer to FIG. 7). It is more preferable that after complete replacement of the hydrophobic agent on the substrate W by IPA, a state of the plurality of guards 11 is switched from the first state to the second state.

A state of the plurality of guards 11 is switched to the second state by the second guard switching step. Therefore, the liquid scattered from the substrate W passes below the extension portion 15 (second extension portion) of the inner guard 11C (second guard) and is received by the tubular portion 14 (second tubular portion) of the inner guard 11C.

After the elapse of a predetermined time (for example, 10 seconds) from a state of the plurality of guards 11 switched to the second state, the drying processing (S9) is started. In the drying processing, the liquid film 100 of the low surface-tension liquid on the substrate W is removed from the substrate W due to a centrifugal force, thereby drying the substrate W (substrate drying step).

In detail, with reference to FIG. 6K and FIG. 7, the organic solvent valve 57 and the gas valve 58 are closed. Thereby, supply of IPA to the upper surface of the substrate W is stopped and supply of nitrogen gas to the space 90 between the upper surface of the substrate W and the facing surface 6a of the facing member 6 is also stopped. Then, the facing member raising/lowering unit 27 moves the facing member 6 to the lower position. Then, the spin motor 23 rotates the substrate W, for example, at 2000 rpm. Thereby, a liquid composition on the substrate W is removed to dry the substrate W.

Thereafter, the spin motor 23 stops rotation of the spin chuck 5. Then, the facing member raising/lowering unit 27 moves the facing member 6 to the upper position. Then, the guard raising/lowering unit 17 positions the plurality of guards 11 at the lower position. Thereafter, with reference to FIG. 1 as well, the transfer robot CF advances into the processing unit 2, scoops up a substrate W which has been processed from the spin chuck 5 and carries it out from the processing unit 2 (S10). The substrate W is delivered from the transfer robot CR to the transfer robot IR and housed in the carrier C by the transfer robot IR.

Then, a description will be given of a change in humidity inside the space 90 between the facing surface 6a of the facing member 6 and the upper surface of the substrate W.

Here, the smaller the distance between the facing surface 6a of the facing member 6 and the upper surface of the substrate W is, the smaller the volume of the atmosphere to be replaced by a gas such as nitrogen gas will be. Therefore, there is increased a ratio of a gas which is pushed out from the space between the facing surface 6a and the upper surface of the substrate W by nitrogen gas per unit time in the atmosphere between the facing surface 6a and the upper surface of the substrate W. Therefore, the smaller the distance between the facing surface 6a of the facing member 6 and the upper surface of the substrate W is, the more the humidity inside the space 90 between the facing surface 6a of the facing member 6 and the upper surface of the substrate W comes close to the humidity of the gas discharged from the central opening 6b of the facing member 6. That is, the humidity is decreased inside the space 90 between the facing surface 6a of the facing member 6 and the upper surface of the substrate W.

Further, the larger the flow rate of the gas discharged from the central opening 6b of the facing member 6 is, the more the humidity inside the space 90 between the facing surface 6a of the facing member 6 and the upper surface of the substrate W comes close to the humidity of the gas discharged from the central opening 6b of the facing member 6. That is, the humidity is decreased inside the space 90 between the facing surface 6a of the facing member 6 and the upper surface of the substrate W.

With reference to FIG. 7, in the hydrophobic agent processing (S7), the facing member raising/lowering unit 27 positions the facing member 6 at the first proximity position which is further separated from the upper surface of the substrate W than the second proximity position. The gas valve 59 is also adjusted for its opening degree and the discharged nitrogen gas is set to be relatively small in flow rate. Therefore, the humidity inside the space 90 between the facing surface 6a of the facing member 6 and the upper surface of the substrate W is adjusted to be relatively high in humidity (first humidity) (humidity adjusting step). It is not necessary that the humidity of the entire space 90 is set to be the first humidity, so long as at least the humidity of the atmosphere in contact with the liquid film 100 on the substrate W is the first humidity.

In the low surface-tension liquid processing (S8), the facing member raising/lowering unit 27 positions the facing member 6 at the second proximity position. That is, the distance between the facing surface 6a and the upper surface of the substrate W is changed from the first distance L1 to the second distance L2. Further, the gas valve 59 is adjusted for its opening degree and nitrogen gas is changed so as to be relatively large in discharge flow rate. Thereby, the humidity inside the space 90 is adjusted to be the second humidity lower than the first humidity (humidity adjusting step). It is not necessary that the humidity of the entire space 90 is set to be the second humidity, so long as at least the humidity of the atmosphere in contact with the liquid film 100 on the substrate W is the second humidity.

In the organic solvent processing (S6), the facing member raising/lowering unit 27 positions the facing member 6 at the second proximity position. Further, the gas valve 59 is adjusted for its opening degree and the nitrogen gas is set to be relatively large in discharge flow rate. Consequently, the humidity inside the space 90 is adjusted to a third humidity which is humidity lower than the first humidity (humidity adjusting step). In this substrate processing, immediately after the start of supplying the nitrogen gas in the second rinse liquid processing (S5), the humidity inside the space 90 has been already adjusted to the third humidity. However, the humidity inside the space 90 may be adjusted so as to be the third humidity at the start of the organic solvent processing (S6). It is not necessary that the humidity of the entire space 90 is set to be the third humidity, so long as at least the humidity of the atmosphere in contact with the liquid film 100 on the substrate W is the third humidity.

In this preferred embodiment, the position of the facing member 6 in the organic solvent processing (S6) is the second proximity position which is the same position as that of the facing member 6 in the low surface-tension liquid processing (S8), so that the third humidity is substantially similar in humidity to the second humidity. As described so far, the facing member raising/lowering unit 27 and the gas valve 59 function as a humidity adjusting unit. Further, the humidity adjusting step is executed during execution of the gas supplying step.

As described so far, according to the present preferred embodiment, the substrate W held by the spin chuck 5 (the substrate holding unit) at a position surrounded by the plurality of guards 11 is rotated by the spin motor 23 (the substrate rotating unit) around the rotation axis A1 (substrate rotating step). The hydrophobic agent is supplied from the second tube 36 (the hydrophobic agent supplying unit) to the upper surface of the substrate W in the rotating state (hydrophobic agent supplying step). In order to replace the hydrophobic agent on the substrate W by IPA (low surface-tension liquid), IPA is supplied from the third tube 37 (the low surface-tension liquid supplying unit) to the upper surface of the substrate in the rotating state (low surface-tension liquid supplying step). The guard raising/lowering unit 17 (the guard switching unit) switches a state of the plurality of guards 11 to the first state before start of the low surface-tension liquid supplying step (first guard switching step) and switches a state of the plurality of guards 11 from the first state to the second state during execution of the low surface-tension liquid supplying step (second guard switching step).

According to the above-described configuration, before the low surface-tension liquid supplying step, the upper surface of the substrate W is hydrophobized by the hydrophobic agent. Accordingly, a surface tension of IPA applied to the upper surface of the substrate W is lowered.

Further, during execution of the low surface-tension liquid supplying step, the state of the plurality of guards 11 is switched from the first state to the second state. That is, after the hydrophobic agent on the substrate W has been at least partially scattered from the substrate W, the guard 11 for receiving the liquid scattered from the substrate W is switched from the outer guard 11A (first guard) to the inner guard 11C (second guard). Therefore, the hydrophobic agent is suppressed or prevented from being adhered to the inner guard 11C. It is, thus, possible to suppress the hydrophobic agent from being splashed back from the inner guard 11C and adhered to the upper surface of the substrate W.

Further, a state of the plurality of guards 11 is not switched after completion of the low surface-tension liquid supplying step but is switched during execution of the low surface-tension liquid supplying step. Therefore, even if the hydrophobic agent is splashed back from the outer guard 11A and adhered to the substrate W, the hydrophobic agent on the substrate W is washed away by IPA. Thereby, the generation of particles is suppressed.

Further, until the first state has been switched to the second state, the outer guard 11A is washed by IPA. Thereby, the hydrophobic agent remaining at the outer guard 11A as well as mist and vapor of the hydrophobic agent present in the atmosphere in the vicinity of the outer guard 11A are decreased in amount. Therefore, the hydrophobic agent is suppressed or prevented from being adhered to the substrate W.

As described so far, a surface tension of IPA applied to the upper surface of the substrate W is lowered and the generation of particles is also suppressed. As a result, it is possible to satisfactorily dry the substrate W.

Further, in the present preferred embodiment, the state of the plurality of guards 11 is switched from the first state to the second state by the guard raising/lowering unit 17 in the second guard switching step such that time T1 during which the outer guard 11A receives IPA in the low surface-tension liquid supplying step will be made longer than time T2 during which the inner guard 11C receives IPA in the low surface-tension liquid supplying step.

Accordingly, it is possible to decrease an amount of the hydrophobic agent present on the substrate W when the first state is switched to the second state. Thus, the hydrophobic agent is effectively suppressed or prevented from being adhered to the inner guard 11C. Further, since the outer guard 11A is cleaned for a longer time by IPA, the hydrophobic agent remaining at the outer guard 11A as well as mist and vapor of the hydrophobic agent present in the atmosphere in the vicinity of the outer guard 11A are decreased in amount.

Further, according to such a configuration that, in the second guard switching step, after the hydrophobic agent on the substrate W has been replaced by IPA, a state of the plurality of guards 11 is switched from the first state to the second state, the hydrophobic agent is more effectively suppressed or prevented from being adhered to the inner guard 11C.

Further, in the present preferred embodiment, the substrate W is rotated by the spin motor 23 to remove IPA on the substrate W, thereby drying the substrate W (substrate drying step). Accordingly, it is possible to quickly remove IPA on the substrate W. It is, therefore, possible to reduce the time that a surface tension of IPA is applied to the upper surface of the substrate W.

Further, in the present preferred embodiment, in the first guard switching step, at least one of an upper end 11$a$ of the outer guard 11A and that of the inner guard 11C is positioned by the guard raising/lowering unit 17 at a height position equal to the facing surface 6$a$ or higher than the facing surface 6$a$, thereby executing the sealing step. Accordingly, a space between the upper surface of the substrate and the facing surface is enhanced in degree of sealing. Then, the atmosphere between the upper surface of the substrate W and the facing surface 6$a$ is evacuated by the evacuating unit 8. In a state that the space between the upper surface of the substrate and the facing surface is enhanced in degree of sealing, the atmosphere between the upper surface of the substrate W and the facing surface 6 can be evacuated to efficiently remove mist of the hydrophobic agent drifting between the upper surface of the substrate W and the facing surface 6$a$. Thereby, the hydrophobic agent is suppressed from being adhered to the upper surface of the substrate W, while IPA is supplied to the substrate W.

Further, in the present preferred embodiment, in the first state, the liquid scattered from the substrate W passes between the extension portion 15 (first extension portion) of the outer guard 11A and the extension portion 15 (second extension portion) of the inner guard 11C and is received by the tubular portion 14 (first tubular portion) of the outer guard 11A. Then, in the second guard switching step, an interval between the extension portion 15 of the outer guard 11A and the extension portion 15 of the inner guard 11C is made narrow. In the second state, the liquid scattered from the substrate W passes below the extension portion 15 of the inner guard 11 and is received by the tubular portion 14 (second tubular portion) of the inner guard 11C.

According to the above-described configuration, the hydrophobic agent scattered from the substrate W passes between the extension portion 15 of the outer guard 11A and the extension portion 15 of the inner guard 11C and is received by the tubular portion 14 of the outer guard 11A. Accordingly, mist of the hydrophobic agent may drift between the extension portion 15 of the outer guard 11A and the extension portion 15 of the inner guard 11C. Therefore, before the state of the plurality of guards 11 is switched to the second state, a liquid which has incorporated mist of the hydrophobic agent may be splashed back from the plurality of guards 11 and adhered to the upper surface of the substrate W.

On the other hand, after the state of the plurality of guards 11 has been switched to the second state, the liquid scattered from the substrate W passes below the extension portion 15 of the inner guard 11C and is received by the tubular portion 14 of the inner guard 11C. That is, the liquid scattered from the substrate W passes through a passage different from a passage between the extension portion 15 of the outer guard 11A and the extension portion 15 of the inner guard 11C at which mist of the hydrophobic agent may drift. Therefore, the liquid splashed back from the plurality of guards 11 is suppressed from incorporating mist of the hydrophobic agent.

Further, even after a state of the plurality of guards 11 has been switched to the second state, mist of the hydrophobic agent may flow out between the extension portion 15 of the outer guard 11A and the extension portion 15 of the inner guard 11C, reach the space 90 between the facing surface 6$a$ of the facing member 6 and the upper surface of the substrate W and finally be adhered to the upper surface of the substrate W. Thus, when the state of the plurality of guards 11 is switched from the first state to the second state, an interval between the extension portion 15 of the outer guard 11A and the extension portion 15 of the inner guard 11C is made narrow, by which mist of the hydrophobic agent is suppressed from flowing out from the space 90.

Further, in the present preferred embodiment, while IPA is discharged from the discharge port 36$a$ of the second tube 36, the state of the plurality of guards 11 is switched to the second state. Accordingly, the plurality of guards 11 are moved up and down during discharge of IPA, by which the state of the plurality of guards 11 is switched to the second state. Thereby, a portion of the outer guard 11A and that of the inner guard 11C which receive IPA scattered from the substrate W are changed during discharge of IPA. Therefore, when a state of the plurality of guards 11 is switched to the second state, the outer guard 11A can be cleaned.

Further, in the present preferred embodiment, before the hydrophobic agent supplying step, the chemical liquid supplying step is executed. After the chemical liquid supplying step and also before the hydrophobic agent supplying step, the rinse liquid supplying step is executed. Then, after the rinse liquid supplying step and before the hydrophobic agent supplying step, the organic solvent supplying step is executed.

According to the above-described configuration, an organic solvent such as IPA, etc., is mixed (miscible) with both a rinse liquid such as carbonated water, etc., and a hydrophobic agent. Therefore, even where the rinse liquid is not mixed (miscible) with the hydrophobic agent, the organic solvent is supplied to the upper surface of the substrate W to replace the rinse liquid on the substrate W by the organic solvent. And, thereafter, the hydrophobic agent is supplied to the upper surface of the substrate W to replace organic solvent on the substrate W by the hydrophobic agent, thus making it possible to cover the upper surface of the substrate W by the hydrophobic agent. Therefore, the degree of freedom is enhanced in selecting the rinse liquid and the hydrophobic agent.

Further, in the present preferred embodiment, in parallel with the organic solvent supplying step, executed is the heating fluid supplying step which supplies warm water (heating fluid) to the lower surface of the substrate W. Therefore, before the hydrophobic agent supplying step, the substrate W is heated in advance by warm water. Accordingly, the hydrophobic agent can be increased in activity. Thereby, the upper surface of the substrate W can be uniformly hydrophobized. Therefore, it is possible to suppress collapse of a pattern.

The present invention is not restricted to the preferred embodiments described above and may be executed in yet other embodiments.

For example, in the above-described preferred embodiment, the outer guard 11A was the guard 11 (first guard) for receiving the liquid scattered from the substrate W in the first state, and the inner guard 11C was the guard 11 (second guard) for receiving the liquid scattered from the substrate W in the second state. However, any one of the outer guard 11A, the center guard 11B and the inner guard 11C suffices to function as a first guard and, of the outer guard 11A, the center guard 11B and the inner guard 11C, a guard different from the guard functioning as the first guard suffices to function as a second guard.

Further, in the above-described preferred embodiment, a total of three guards 11 were provided. However, unlike the above-described preferred embodiment, there may be such an embodiment that a total of two guards 11 are provided or there may be such an embodiment that a total of four guards are provided.

Further, in the substrate processing of the above-described preferred embodiment, the upper end 11a of the guard 11 was positioned at a height position higher than the facing surface 6a, thereby enhancing the degree of sealing of the space 90. However, unlike the substrate processing of the above-described preferred embodiment, the upper end 11a of the guard 11 may be positioned at a height position equal to the facing surface 6a, thereby enhancing the degree of sealing of the space 90.

Further, in the above-described preferred embodiment, the humidity inside the space 90 was adjusted by changing a distance between the facing surface 6a of the facing member 6 and the upper surface of the substrate W and changing a discharge flow rate of nitrogen gas from the central opening 6b of the facing member 6. However, unlike the above-described preferred embodiment, the humidity inside the space 90 may be adjusted only by changing a distance between the facing surface 6a of the facing member 6 and the upper surface of the substrate W. In this case, from the second rinse liquid processing (S5) to the low surface-tension liquid processing (S8), nitrogen gas is discharged at a fixed flow rate from the central opening 6b of the facing member 6. Further, the opening degree (aperture) of the evacuation valve 10 is kept constant. The humidity inside the space 90 may be adjusted by changing a distance between the facing surface 6a of the facing member 6 and the upper surface of the substrate W and changing the opening degree of the evacuation valve 10.

Further, in the hydrophobic agent processing (S7), the hydrophobic agent may be supplied to the upper surface of the substrate W by discharging the hydrophobic agent from the internal nozzle 38.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The present application corresponds to Japanese Patent Application No. 2017-166501 filed in the Japan Patent Office on Aug. 31, 2017, and the entire disclosure of this application is incorporated herein by reference.

What is claimed is:

1. A substrate processing method comprising:
   a substrate holding step of disposing a substrate at a position surrounded by a plurality of guards which have a first guard and a second guard in a plan view and of holding the substrate horizontally;
   a substrate rotating step of rotating the substrate around a vertical rotation axis passing through a central portion of the substrate;
   a hydrophobic agent supplying step of supplying to an upper surface of the substrate in a rotating state a hydrophobic agent which is a liquid for hydrophobizing the upper surface of the substrate;
   a low surface-tension liquid supplying step of supplying the low surface-tension liquid to the upper surface of the substrate in the rotating state in order to replace the hydrophobic agent on the substrate by a low surface-tension liquid lower in surface tension than water;
   a first guard switching step of switching a state of the plurality of guards to a first state in which the first guard receives a liquid scattered from the substrate by moving at least one of the plurality of guards up and down before start of the low surface-tension liquid supplying step; and
   a second guard switching step of switching the state of the plurality of guards from the first state to a second state in which the second guard receives a liquid scattered from the substrate by moving the plurality of guards up and down during execution of the low surface-tension liquid supplying step.

2. The substrate processing method according to claim 1, wherein the second guard switching step includes a step of switching the state of the plurality of guards from the first state to the second state such that time during which the first guard receives the low surface-tension liquid will be made longer than time during which the second guard receives the low surface-tension liquid.

3. The substrate processing method according to claim 1, wherein the second guard switching step includes a step of switching the state of the plurality of guards from the first state to the second state after the hydrophobic agent on the substrate has been replaced by the low surface-tension liquid.

4. The substrate processing method according to claim 1, further comprising: a substrate drying step in which the substrate is rotated to remove the low surface-tension liquid on the substrate, thereby drying the substrate.

5. The substrate processing method according to claim 1, further comprising: an evacuating step of evacuating the atmosphere between the upper surface of the substrate and a facing surface, which faces the upper surface of the substrate, of a facing member after the first guard switching step;
   wherein the first guard switching step includes a sealing step of positioning at least one of an upper end of the first guard and that of the second guard at a height position equal to the facing surface or higher than the facing surface.

6. The substrate processing method according to claim 1, wherein the low surface-tension liquid supplying step includes a step of discharging the low surface-tension liquid to the upper surface of the substrate from a discharge port, and
   the second guard switching step includes a step which switches a state of the plurality of guards to the second state while the low surface-tension liquid is discharged from the discharge port.

7. The substrate processing method according to claim 1, further comprising: a chemical liquid supplying step of supplying to the upper surface of the substrate a chemical liquid for processing the upper surface of the substrate before the hydrophobic agent supplying step;
   a rinse liquid supplying step of supplying to the upper surface of the substrate a rinse liquid for washing away the chemical liquid after the chemical liquid supplying step and also before the hydrophobic agent supplying step; and
   an organic solvent supplying step of supplying to the upper surface of the substrate an organic solvent which is miscible with the rinse liquid and the hydrophobic agent after the rinse liquid supplying step and also before the hydrophobic agent supplying step.

8. The substrate processing method according to claim 5, wherein, the first guard includes a first tubular portion which surrounds the substrate, and a first extension portion which extends obliquely above from an upper end of the first tubular portion toward the facing member, the second guard includes a second tubular portion which surrounds the substrate inside of the first tubular portion, and a second extension portion which extends obliquely above from an upper end of the second tubular portion toward the facing member and faces the first extension portion from below, the first guard switching step includes a step of switching the state of the plurality of guards to the first state in which a liquid scattered from the substrate passes between the first extension portion and the second extension portion, and is received by the first tubular portion, and the second guard switching step includes a step of switching the state of the plurality of guards to the second state in which an interval between the first extension portion and the second extension portion is made narrower than that in the first state such that a liquid scattered from the substrate passes below the second extension portion and is received by the second tubular portion.

9. The substrate processing method according to claim 7, further comprising: a heating fluid supplying step of supplying a heating fluid for heating the substrate to the lower surface of the substrate in parallel with the organic solvent supplying step.

* * * * *